(12) United States Patent
Kim et al.

(10) Patent No.: US 11,373,647 B2
(45) Date of Patent: Jun. 28, 2022

(54) INTELLIGENT VOICE OUTPUTTING METHOD, APPARATUS, AND INTELLIGENT COMPUTING DEVICE

(71) Applicant: LG ELECTRONICS INC., Seoul (KR)

(72) Inventors: Gyeonghun Kim, Seoul (KR); Yireun Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 365 days.

(21) Appl. No.: 16/553,683

(22) Filed: Aug. 28, 2019

(65) Prior Publication Data

US 2019/0385607 A1    Dec. 19, 2019

(30) Foreign Application Priority Data

Aug. 15, 2019    (KR) .......................... 10-2019-0099959

(51) Int. Cl.
| | |
|---|---|
| *G10L 15/20* | (2006.01) |
| *G10L 15/22* | (2006.01) |
| *G10L 25/84* | (2013.01) |
| *H04W 4/70* | (2018.01) |
| *G10L 15/28* | (2013.01) |

(52) U.S. Cl.
CPC .............. *G10L 15/22* (2013.01); *G10L 15/28* (2013.01); *G10L 25/84* (2013.01); *H04W 4/70* (2018.02); *G10L 2015/223* (2013.01)

(58) Field of Classification Search
USPC ...... 381/300–310, 58–63, 317–318, 91–110; 382/153–160; 704/200–278
See application file for complete search history.

(56) References Cited

U.S. PATENT DOCUMENTS

| | | | |
|---|---|---|---|
| 2018/0047386 A1* | 2/2018 | Garner | .................... G10L 15/08 |
| 2018/0096690 A1* | 4/2018 | Mixter | ................ G10L 21/0216 |
| 2020/0074988 A1* | 3/2020 | Park | ........................ G10L 15/07 |

FOREIGN PATENT DOCUMENTS

| | | |
|---|---|---|
| JP | 2009-192342 A | 8/2009 |
| KR | 10-2015-0103855 A | 9/2015 |
| KR | 10-2017-0043055 A | 4/2017 |

* cited by examiner

*Primary Examiner* — Marcellus J Augustin
(74) *Attorney, Agent, or Firm* — Birch, Stewart, Kolasch & Birch, LLP

(57) ABSTRACT

Provided are an intelligent voice output method, a voice output device and an intelligent computing device. An intelligent voice output method includes obtaining a voice from a plurality of voice output devices, selecting a device for a response to the voice, and controlling the response device based on recognition state information of the voice recognized by the response device so that the response device outputs the response. Accordingly, a response from a voice output device can be clearly delivered to a user. One or more of the voice output devices, intelligent computing devices, and servers of the present invention may include artificial intelligence modules, drones (Unmanned Aerial Vehicles, UAVs), robots, Augmented Reality (AR) devices, and virtual reality (VR) devices, devices related to 5G services, and the like.

13 Claims, 23 Drawing Sheets

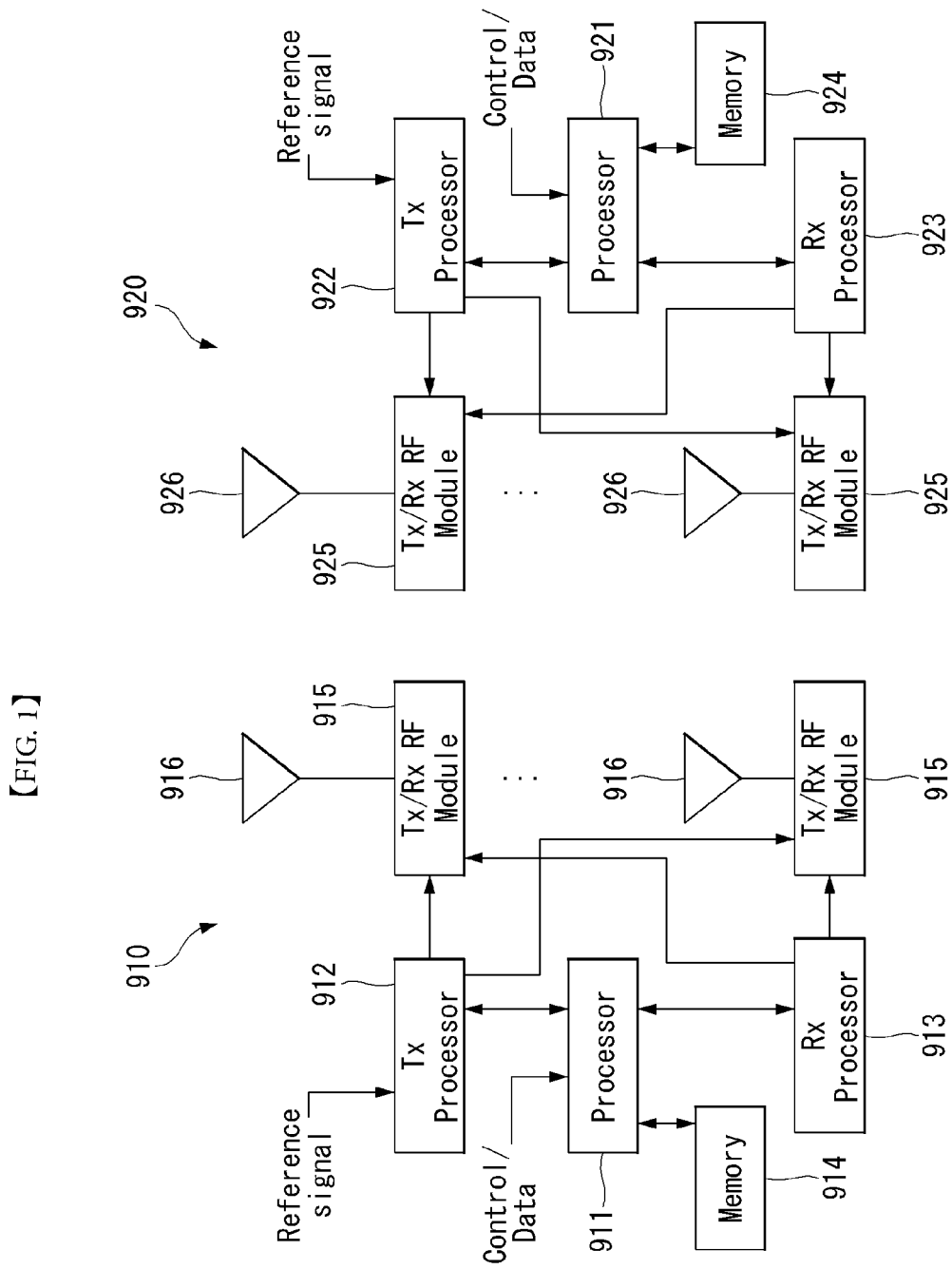
[FIG. 1]

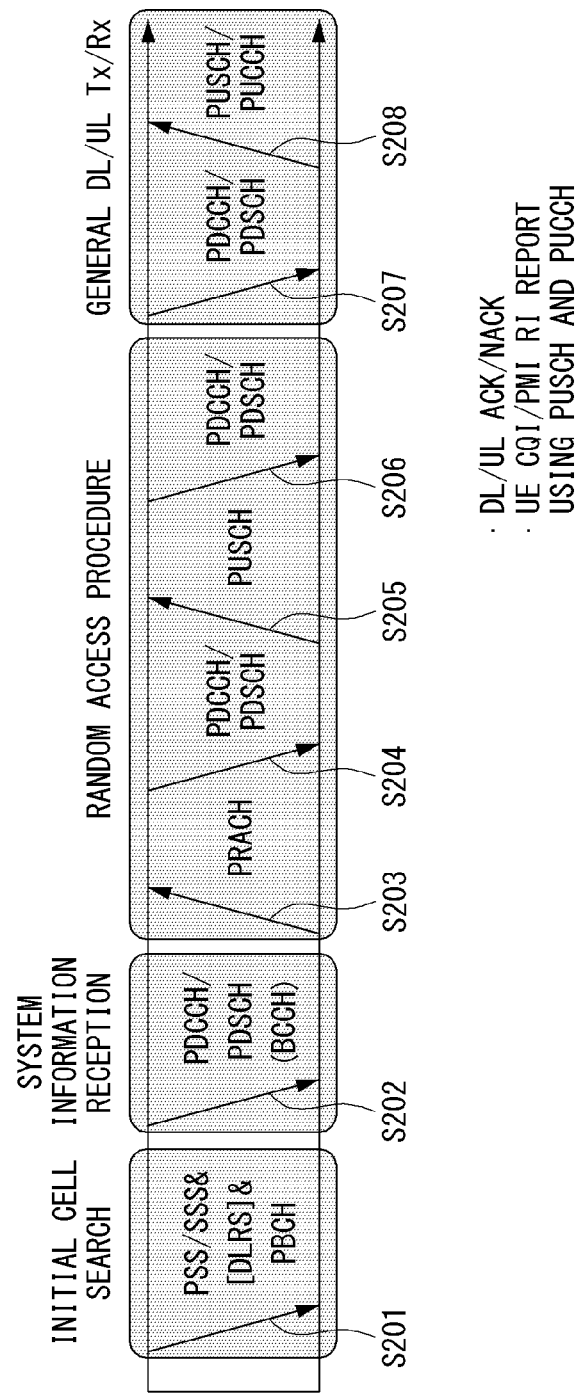
[FIG. 2]

[FIG. 3]
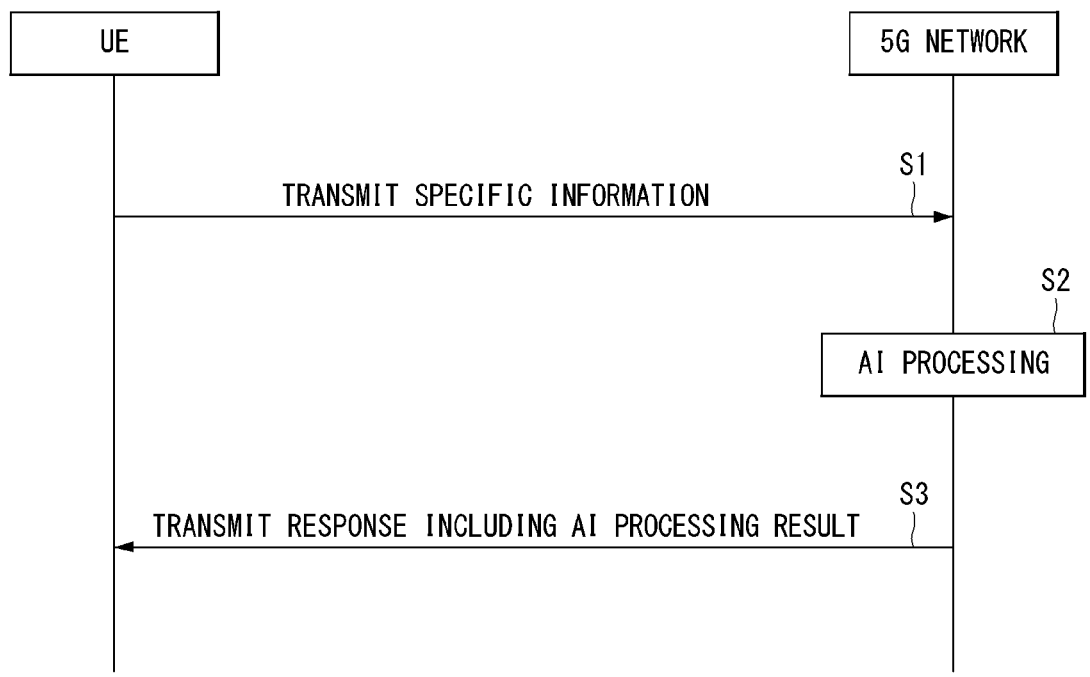

[FIG. 4]
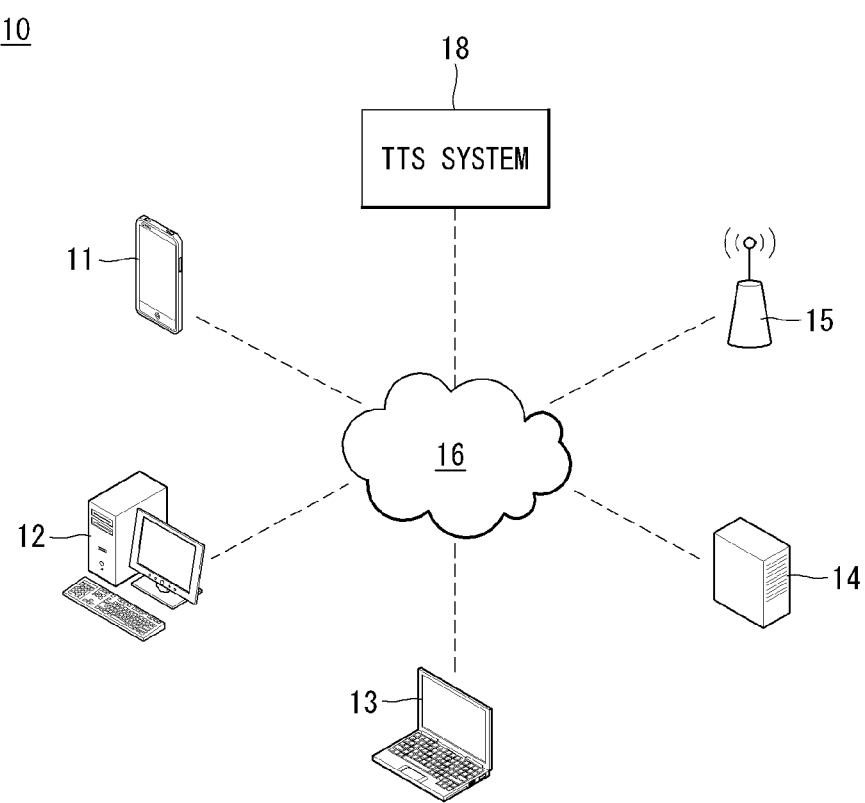

[FIG. 5]
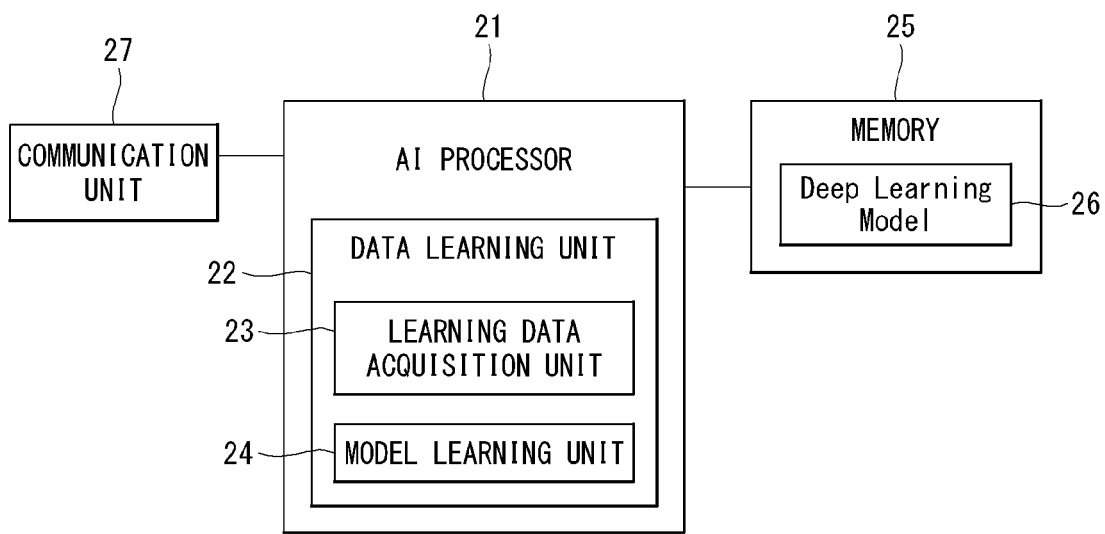

[FIG. 6]
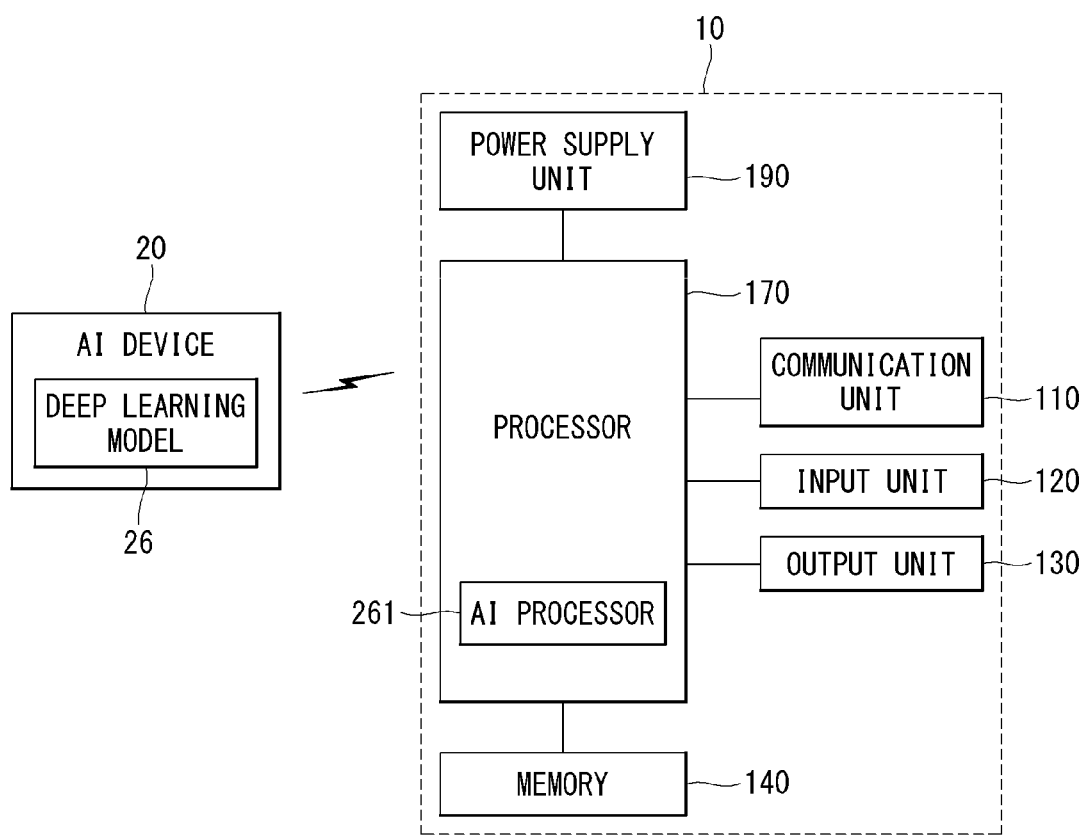

[FIG. 7]
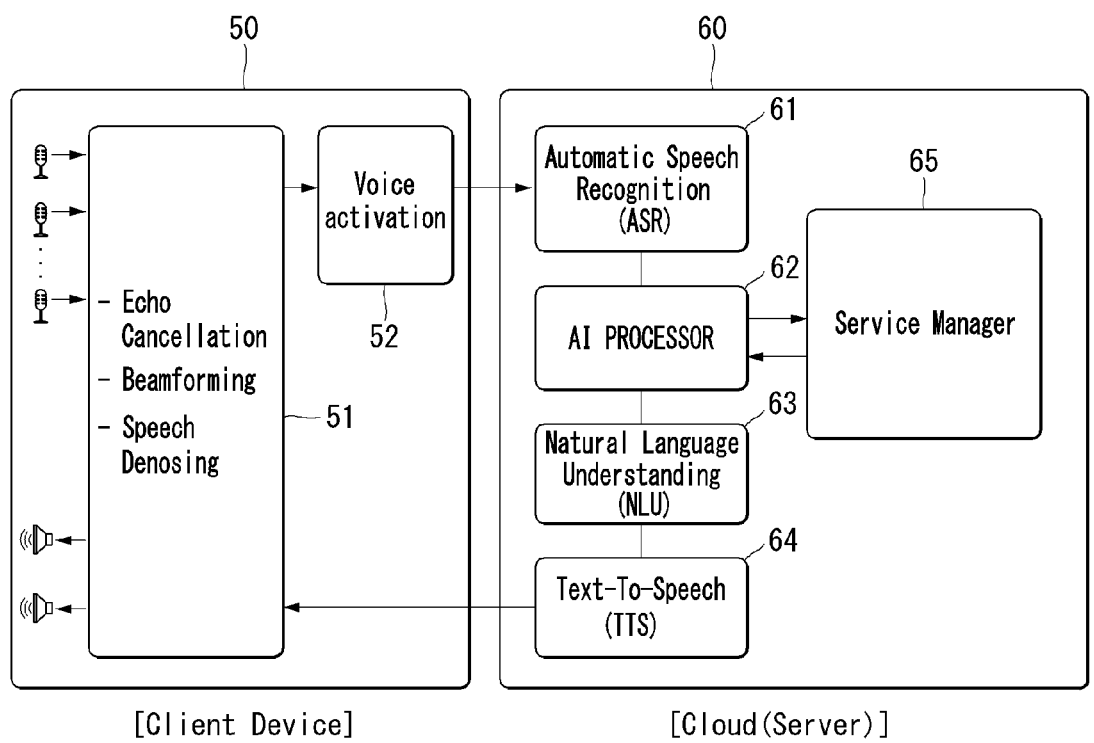

[FIG. 8]
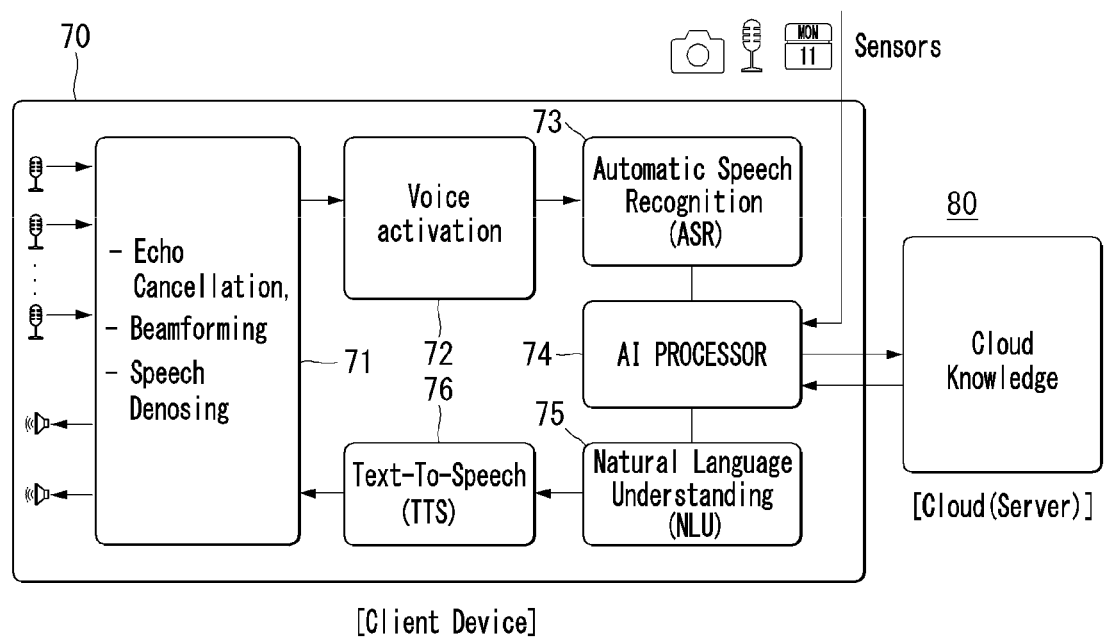

[FIG. 9]
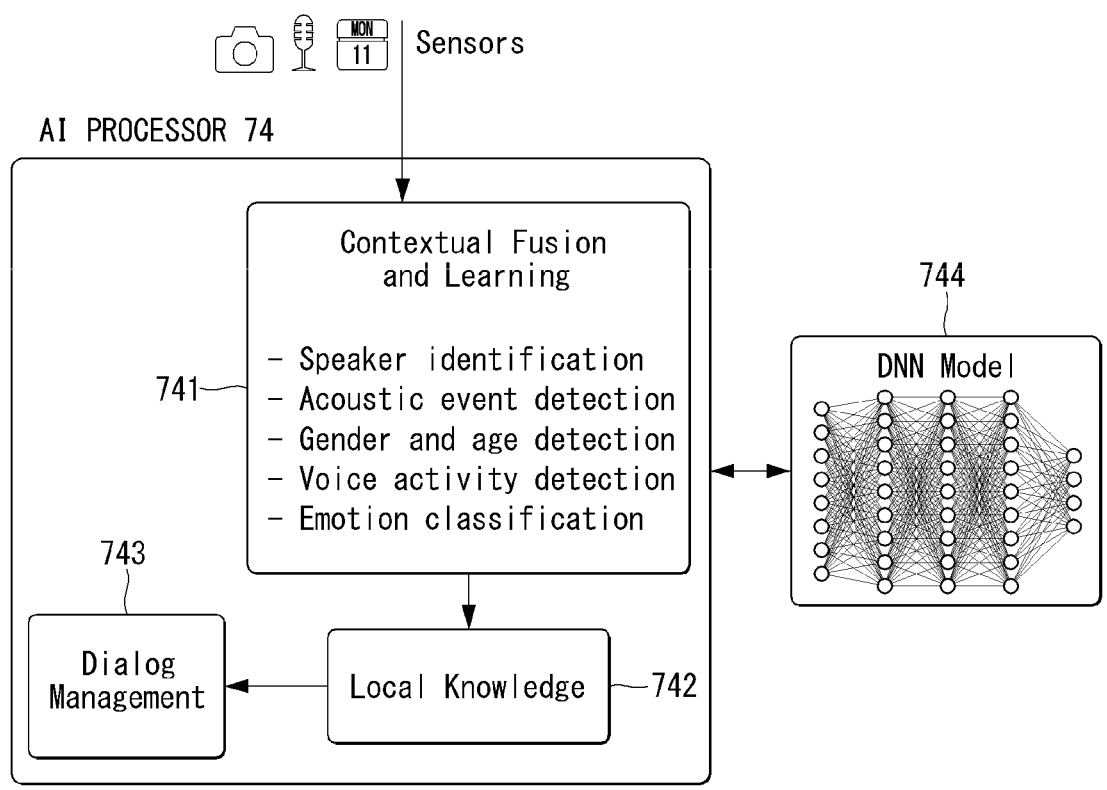

[FIG. 10]
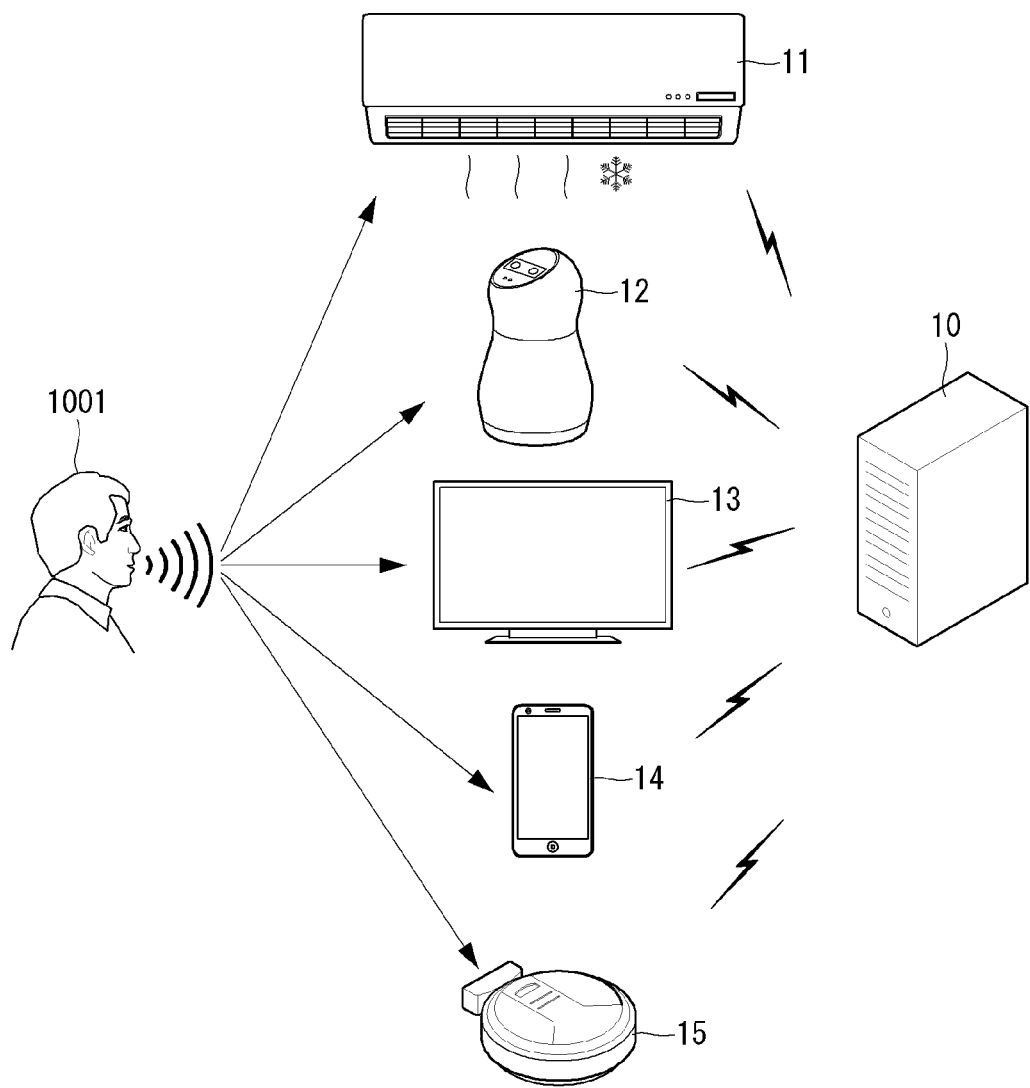

[FIG. 11]
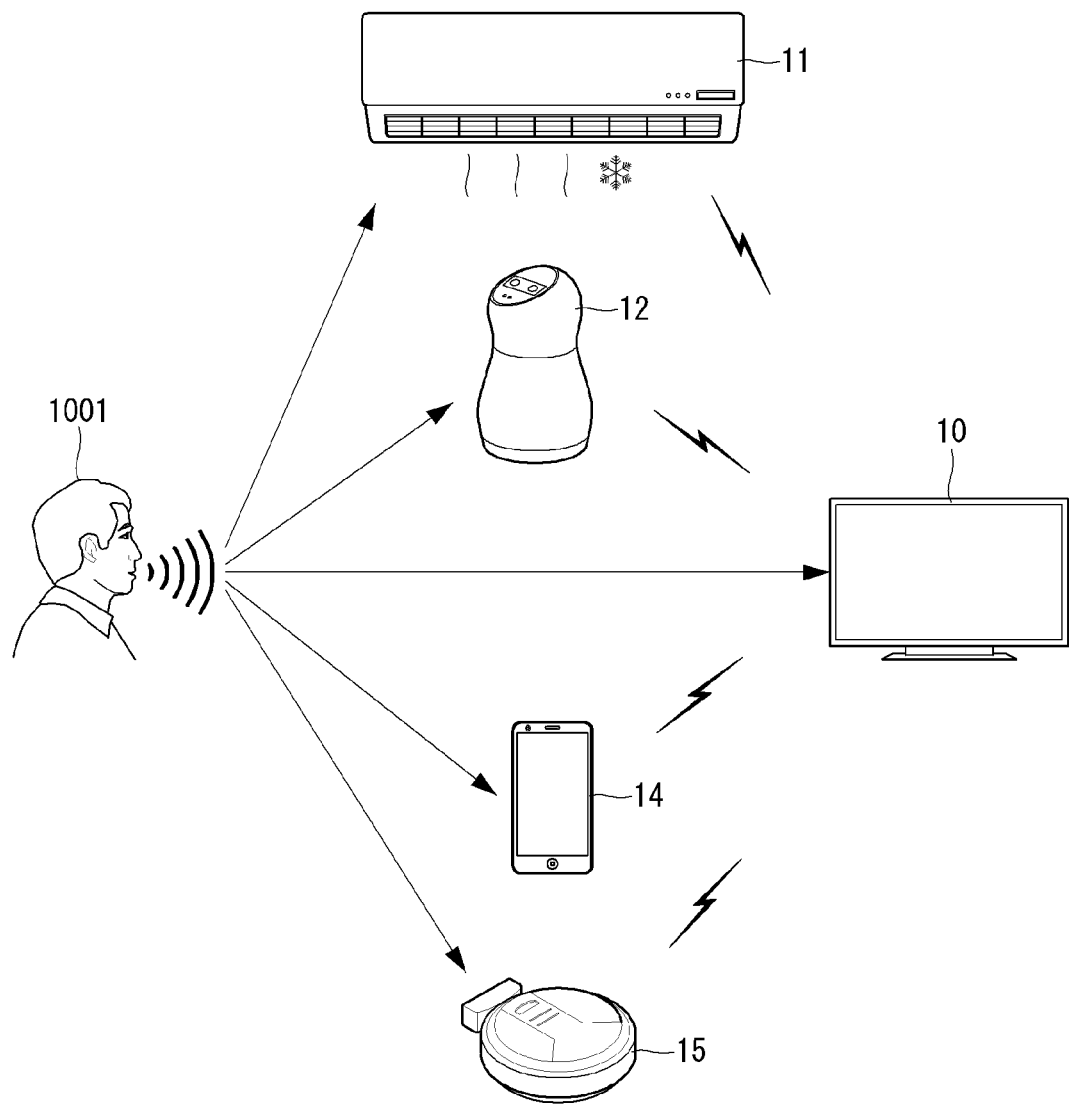

[FIG. 12]
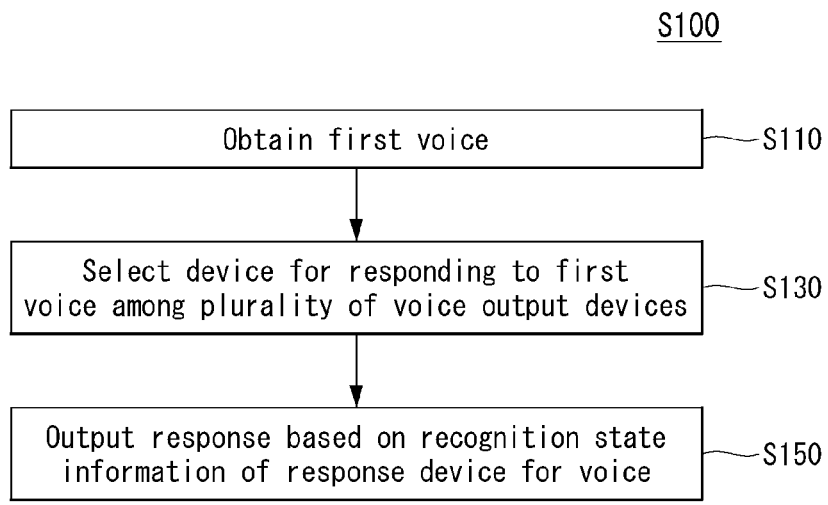
[FIG. 13]
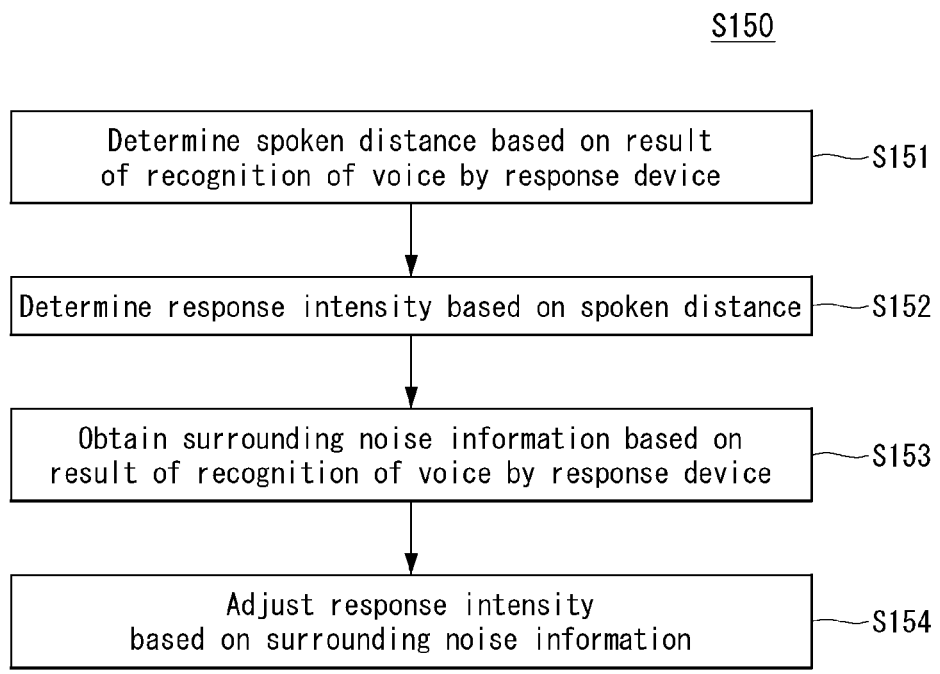

[FIG. 14]
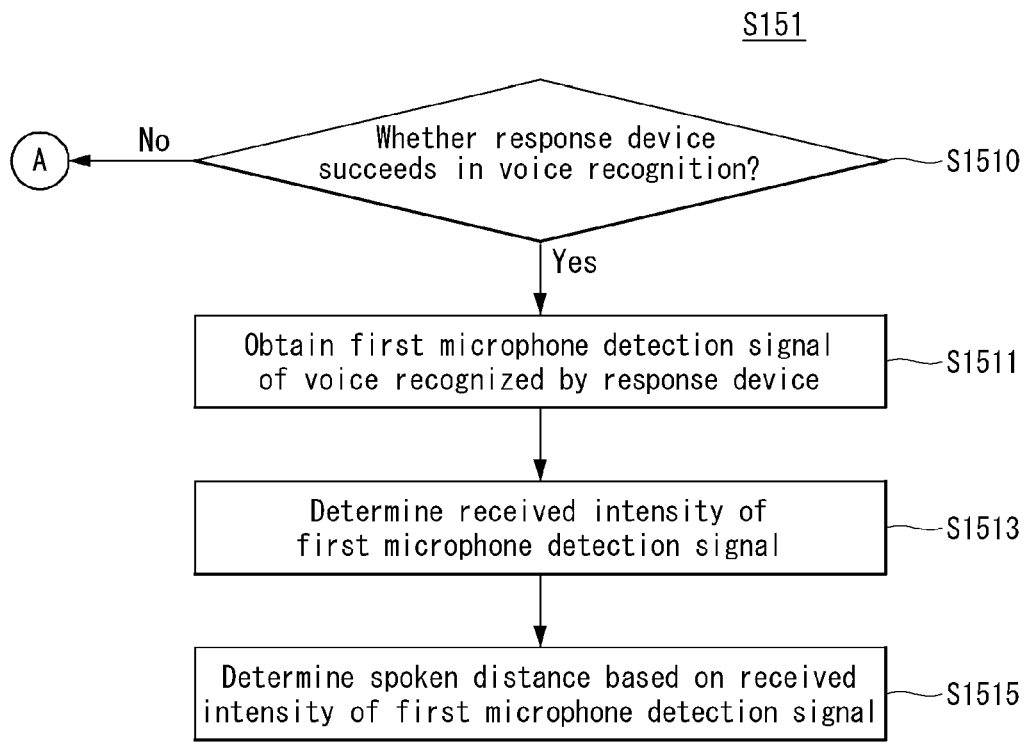
[FIG. 15]
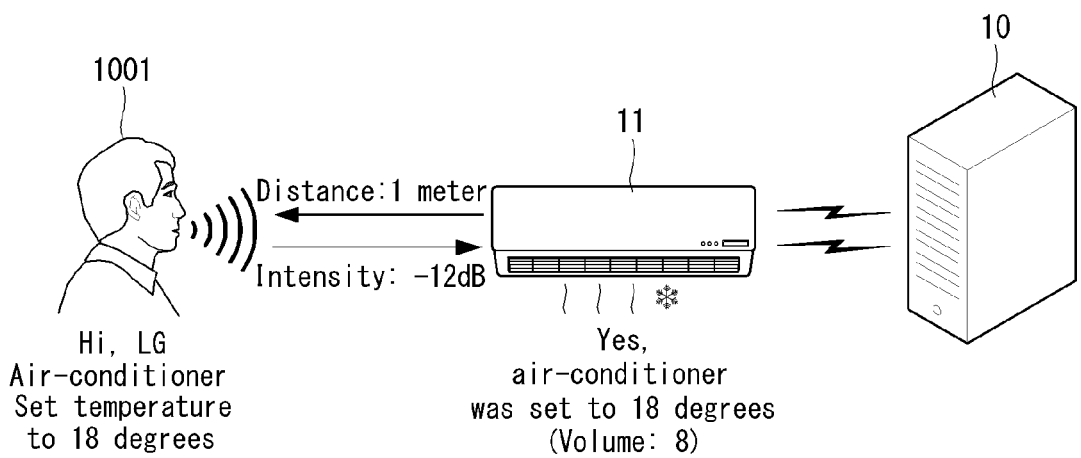

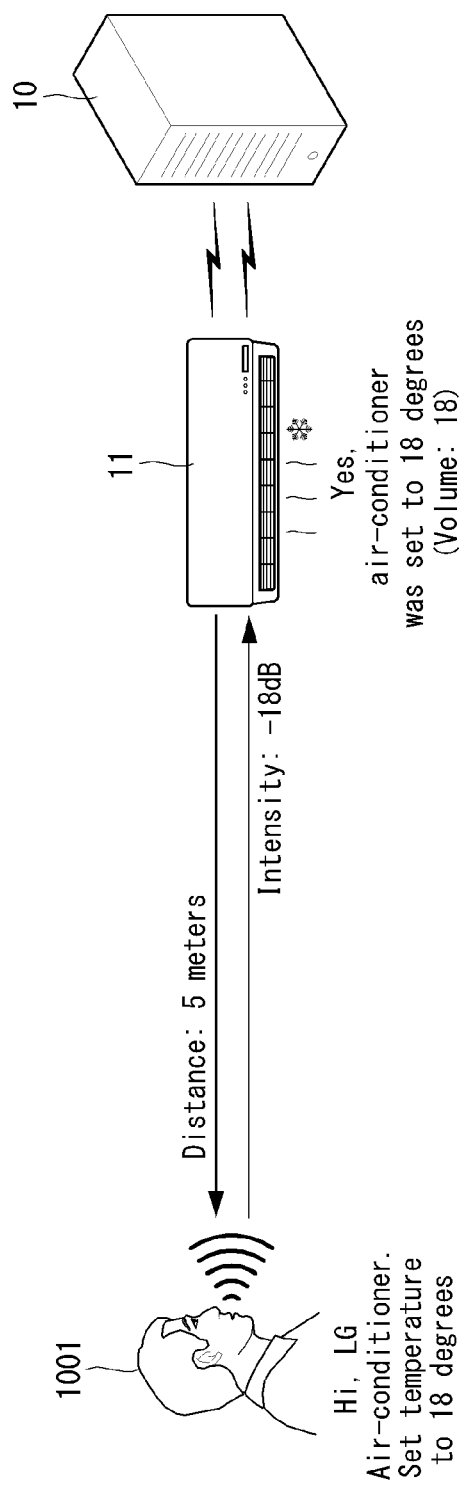

[FIG. 17]
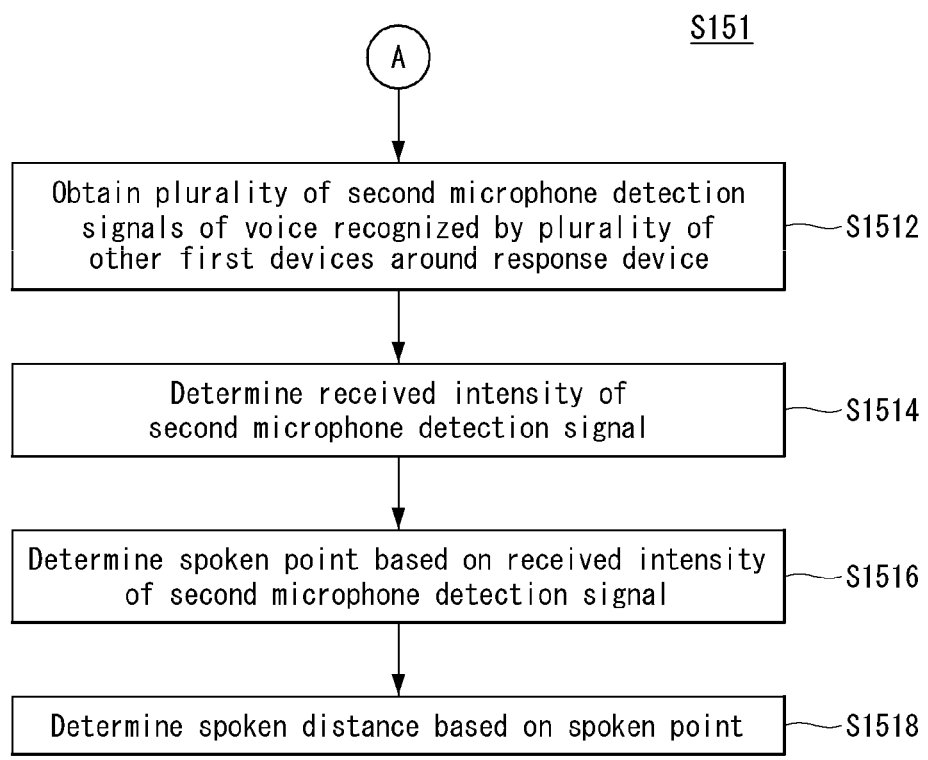

[FIG. 18]
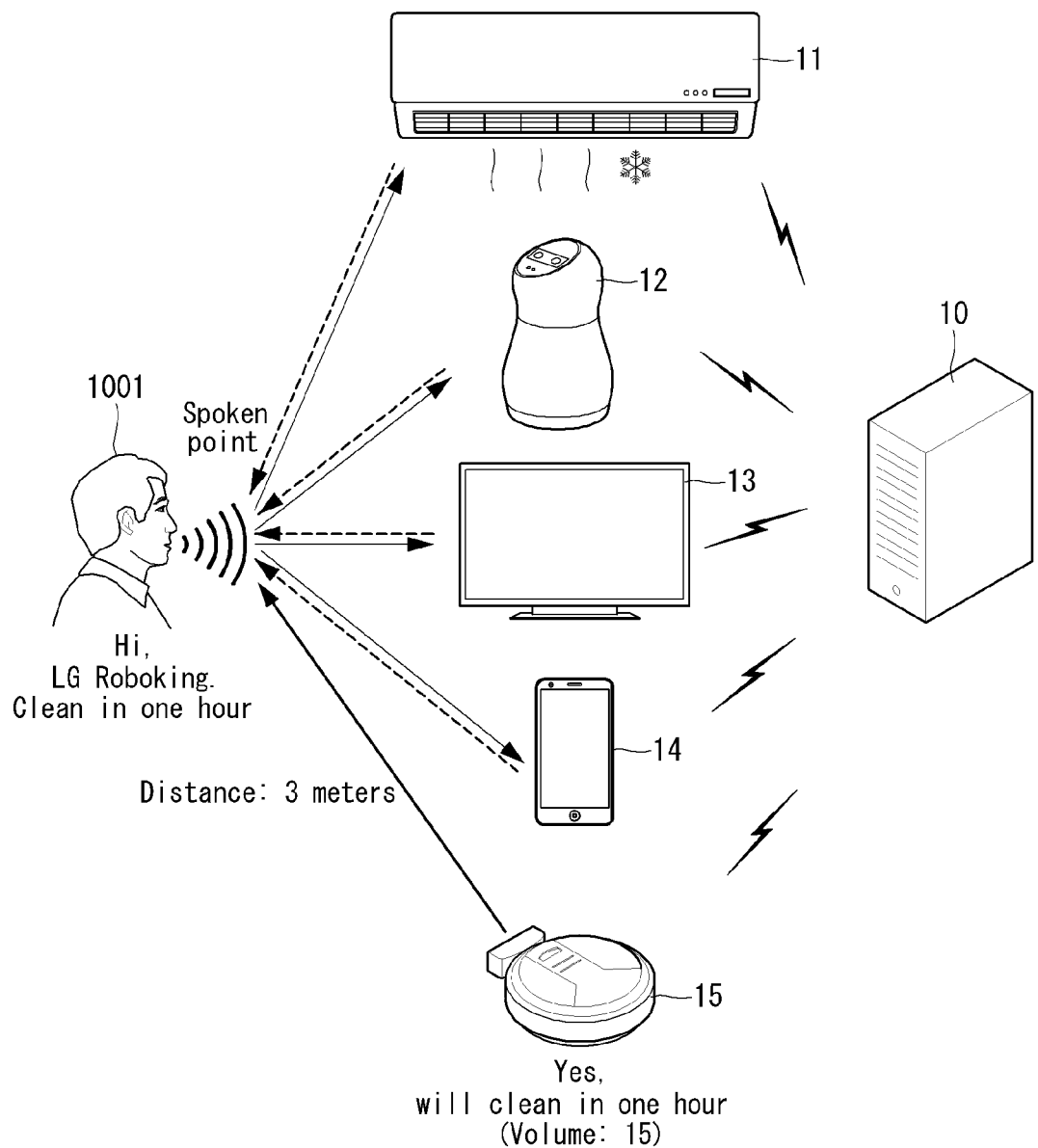

[FIG. 19]
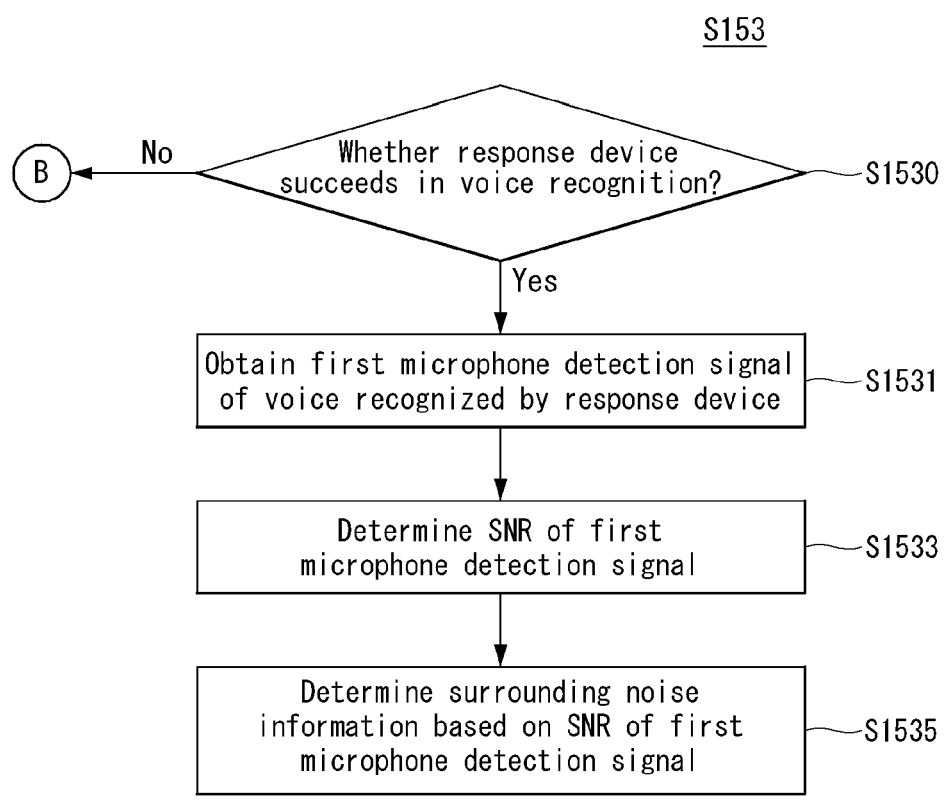

[FIG. 20]
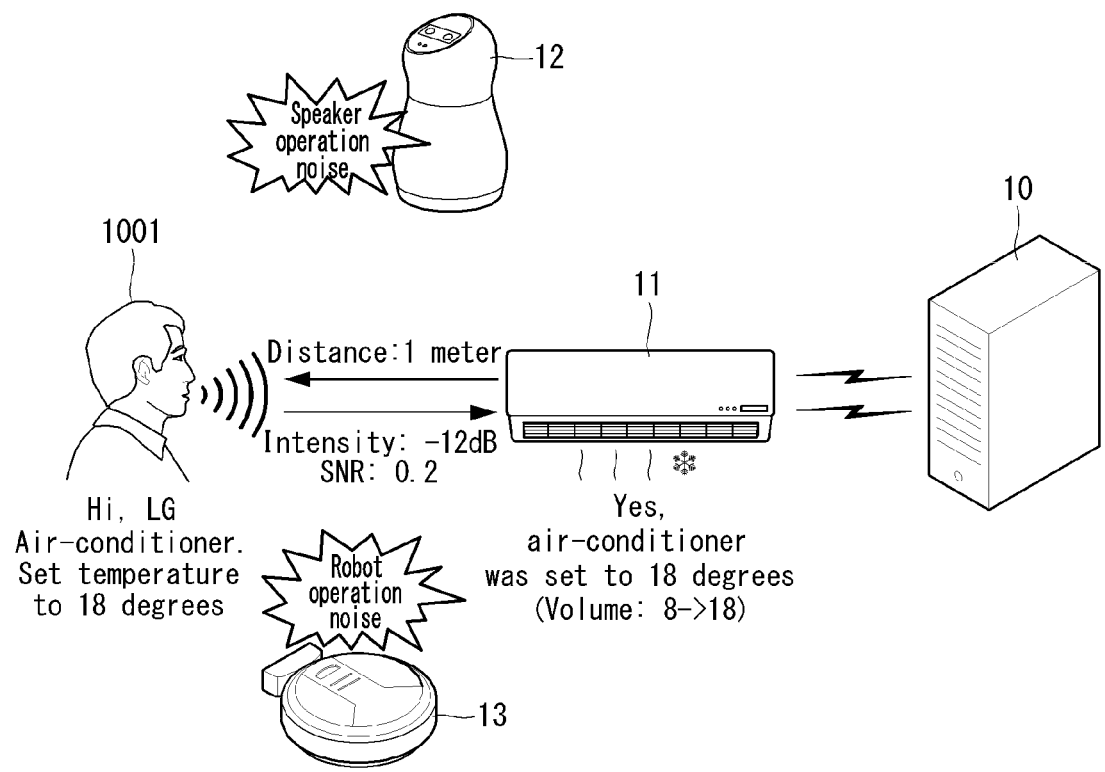

[FIG. 21]
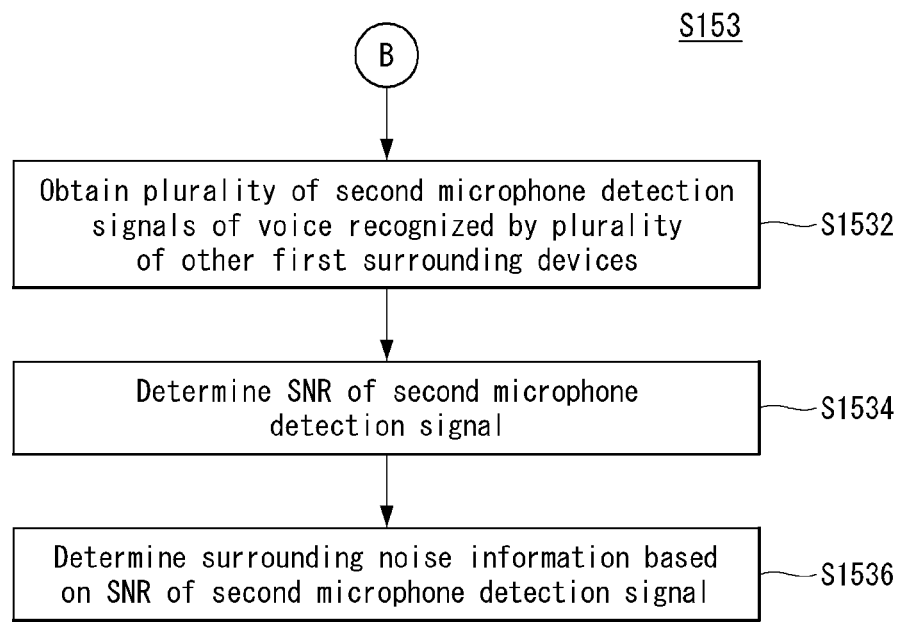

[FIG. 22]
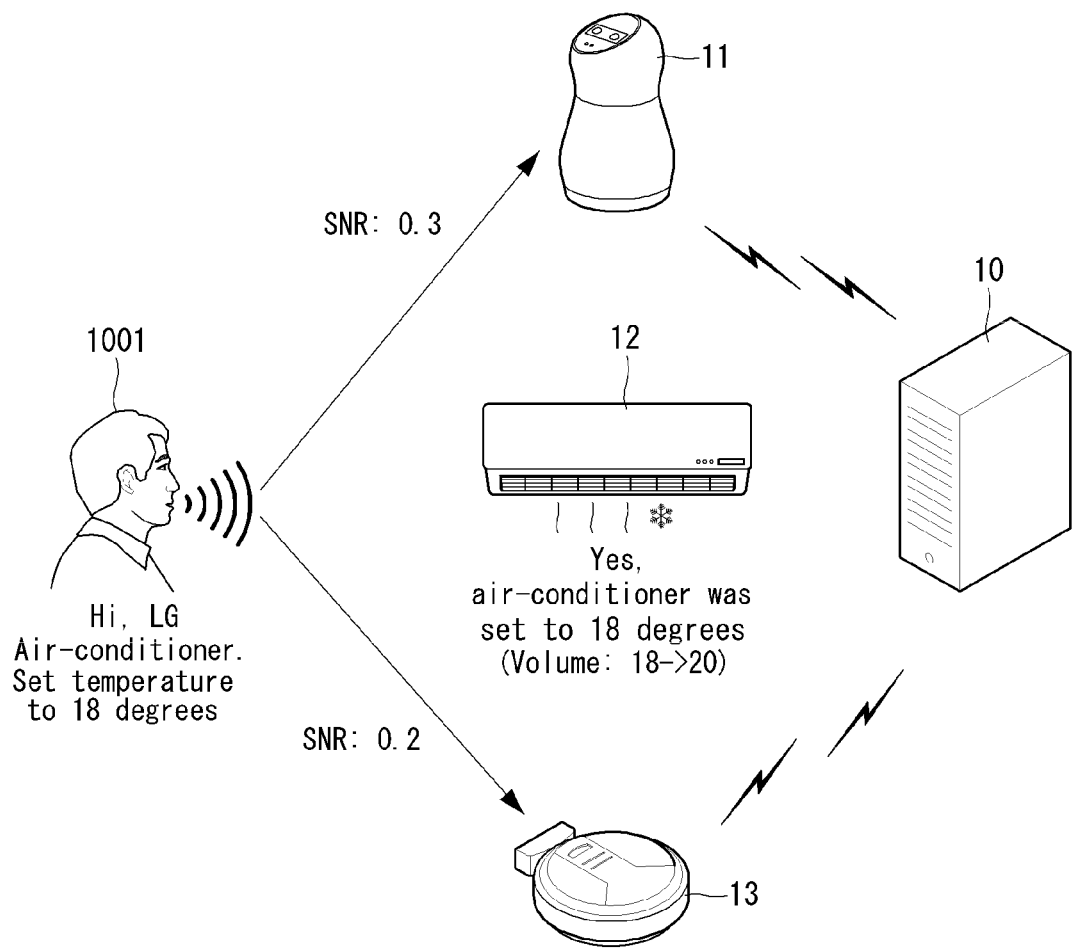

[FIG. 23]
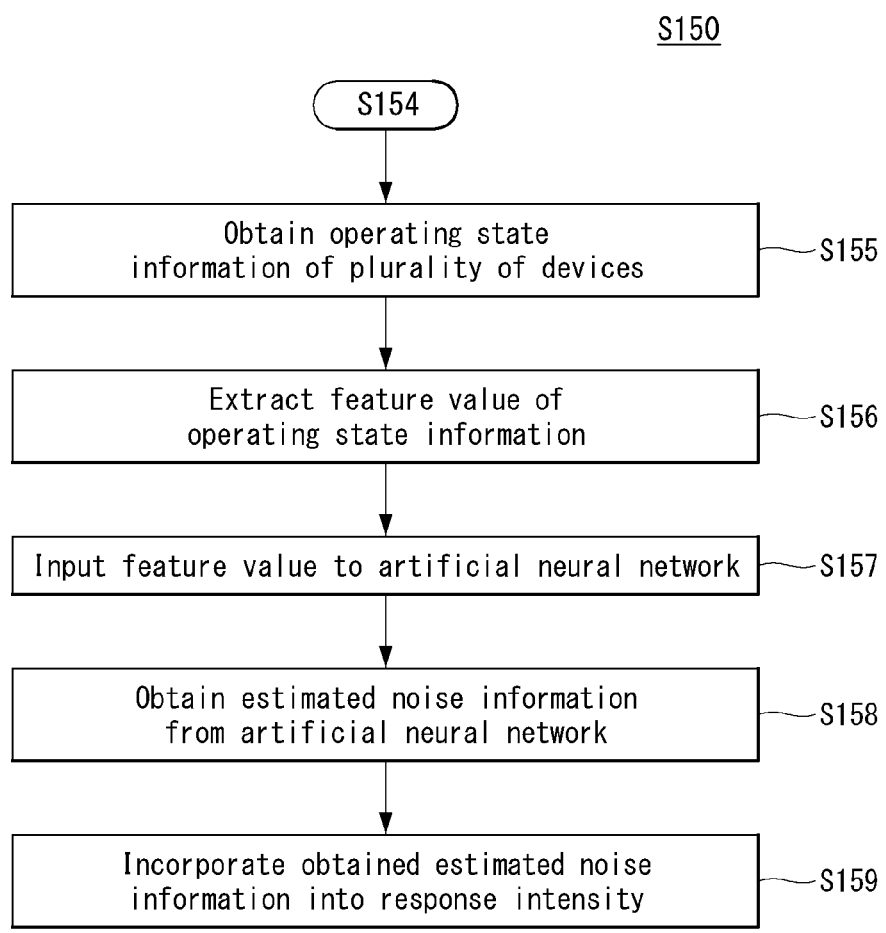

[FIG. 24]
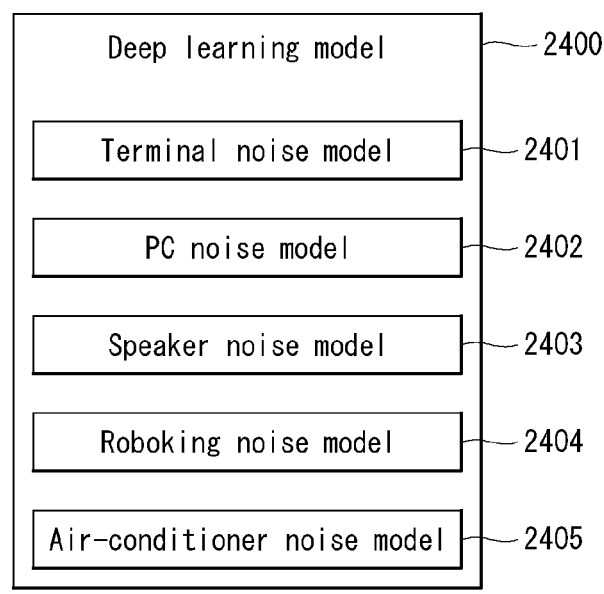

[FIG. 25]

INTELLIGENT VOICE OUTPUTTING METHOD, APPARATUS, AND INTELLIGENT COMPUTING DEVICE

CROSS REFERENCE TO RELATED APPLICATIONS

This application claims the priority benefit of Korean Patent Application No. 10-2019-0099959, filed on Aug. 15, 2019, which is hereby incorporated by reference as if fully set forth herein.

BACKGROUND OF THE INVENTION

Field of the Invention

The present invention relates to an intelligent voice output method, a voice output device, and an intelligent computing device and, more particularly, to an intelligent voice output method, voice output device and intelligent computing device for outputting TTS intelligently.

Related Art

A voice output device can convert a user's voice into text, can analyze the meaning of a message included in the text, and can output a sound of a different form based on a result of the analysis.

Examples of the voice output device may include a home robot of a home IoT system and an artificial intelligence (AI) speaker using an artificial intelligence technique.

A user may control each voice output device using a preset voice. In this case, a corresponding voice output device may not properly recognize a voice because the voice is not forwarded from a user to the voice output device due to noise in the voice output device itself, the distance between the voice output device and a speaker or noise around the voice output device. Accordingly, although the corresponding voice output device outputs a response to the voice, the response is not properly delivered to the user due to the problem.

SUMMARY OF THE INVENTION

An object of the present invention is to meet the needs and solve the problems.

Furthermore, the present invention implements an intelligent voice output method, a voice output device and an intelligent computing device for outputting a response based on the state in which a voice is recognized by a response device.

In an aspect, an intelligent voice output method includes obtaining a voice, selecting a response device for a response to the voice among a plurality of voice output devices, and outputting a response related to the voice through the response device based on recognition state information of the voice recognized by the response device.

Outputting a response may include determining a spoken distance between the response device and a point at which the voice is spoken based on a result of the recognition of the voice by the response device, and outputting the response based on the spoken distance.

Determining a spoken distance may include determining the spoken distance based on received intensity of a first microphone detection signal of the voice recognized by the response device if the response device succeeds in the recognition of the voice, determining the point at which the voice is spoken based on received intensity of a second microphone detection signal of the voice recognized by a first device successful in the recognition of the voice if the response device fails in the recognition of the voice, and determining the spoken distance based on the point at which the voice is spoken.

Outputting a response may further include obtaining noise information around the response device based on the result of the recognition of the voice by the response device and outputting the response based on the surrounding noise information.

Obtaining noise information may include obtaining noise information around the response device based on the signal to noise ratio (SNR) of the first microphone detection signal of the voice recognized by the response device if the response device succeeds in the recognition of the voice, and determining noise information around the response device based on the SNR of the second microphone detection signal of the voice recognized by the first device successful in the recognition of the voice if the response device fails in the recognition of the voice.

Obtaining noise information may include inputting the operating state of at least one of the plurality of voice output devices to a pre-trained noise model, and obtaining estimated noise information determined based on the operating state. Outputting a response may further include outputting the response based on the surrounding noise information and the estimated noise information.

Inputting the operating state to the pre-trained noise model may include accessing a 5G wireless communication system providing a 5th generation (5G) service, connecting to the plurality of voice output devices through the 5G wireless communication system, and receiving the operating state of each of the plurality of voice output devices from the plurality of voice output devices through the 5G service provided by the 5G wireless communication system.

The 5G service may include a massive machine-type communication (mMTC) service. Receiving the operating state of each of the plurality of voice output devices may include receiving the operating state of each of the plurality of voice output devices from the plurality of voice output devices through an MTC physical uplink shared channel (MPUSCH) and/or an MTC physical uplink control channel (MPUCCH) which is a physical resource provided through the mMTC service.

The 5G wireless communication system includes a narrowband-Internet of things (NB-IoT) system providing a system bandwidth related to some resource blocks of the 5G wireless communication system and providing the mMTC service. Receiving the operating state of each of the plurality of voice output devices may include performing an initial access procedure on the 5G wireless communication system through an anchor type carrier related to the NB-IoT system, and receiving the operating state of each of the plurality of voice output devices from the plurality of voice output devices through a non-anchor type carrier related to the NB-IoT system.

Obtaining noise information may include determining the point at which the voice is spoken based on the received intensity of the second microphone detection signal of the voice recognized by the first device successful in the recognition of the voice. Outputting a response may include outputting the response based on first surrounding noise information around the response device and second surrounding noise information around the point at which the voice is spoken.

In an embodiment, an intelligent voice output device includes a communication unit obtaining a voice from a plurality of voice output devices, and a processor configured to select a response device for a response to the voice among the plurality of voice output devices and to control the response device to output a response related to the voice based on recognition state information of the voice recognized by the response device through the communication unit.

The processor may be configured to determine a spoken distance between the response device and a point at which the voice is spoken based on a result of the recognition of the voice by the response device and to control the response device to output the response based on the spoken distance through the communication unit.

The processor may be configured to determine the spoken distance based on received intensity of a first microphone detection signal of the voice recognized by the response device if the response device succeeds in the recognition of the voice, determine the point at which the voice is spoken based on received intensity of a second microphone detection signal of the voice recognized by a first device successful in the recognition of the voice if the response device fails in the recognition of the voice, and determine the spoken distance based on the point at which the voice is spoken.

The processor may be configured to control the response device to obtain noise information around the response device based on the result of the recognition of the voice by the response device and to output the response based on the surrounding noise information.

The processor may be configured to obtain noise information around the response device based on the signal to noise ratio (SNR) of the first microphone detection signal of the voice recognized by the response device if the response device succeeds in the recognition of the voice and to determine noise information around the response device based on the SNR of the second microphone detection signal of the voice recognized by the first device successful in the recognition of the voice if the response device fails in the recognition of the voice.

The processor may be configured to input the operating state of at least one of the plurality of voice output devices to a pre-trained noise model and to control the response device to obtain estimated noise information determined based on the operating state and output the response based on the surrounding noise information and the estimated noise information.

The processor may be configured to control the communication unit to access a 5G wireless communication system providing a 5th generation (5G) service, to connect to the plurality of voice output devices through the 5G wireless communication system, and to receive the operating state of each of the plurality of voice output devices from the plurality of voice output devices through the 5G service provided by the 5G wireless communication system.

The 5G service includes a massive machine-type communication (mMTC) service. The processor may be configured to control the communication unit to receive the operating state of each of the plurality of voice output devices from the plurality of voice output devices through an MTC physical uplink shared channel (MPUSCH) and/or an MTC physical uplink control channel (MPUCCH) which is a physical resource provided through the mMTC service.

The 5G wireless communication system may include a narrowband-Internet of things (NB-IoT) system providing a system bandwidth related to some resource blocks of the 5G wireless communication system and providing the mMTC service. The processor may be configured to control the communication unit to perform an initial access procedure on the 5G wireless communication system through an anchor type carrier related to the NB-IoT system and to receive the operating state of each of the plurality of voice output devices from the plurality of voice output devices through a non-anchor type carrier related to the NB-IoT system.

The processor may be configured to control the response device to determine the point at which the voice is spoken based on the received intensity of the second microphone detection signal of the voice recognized by the first device successful in the recognition of the voice, and to output the response based on first surrounding noise information around the response device and second surrounding noise information around the point at which the voice is spoken.

In another embodiment, a non-transitory computer-readable recording medium is a non-transitory computer-readable recording medium in which a computer-executable component configured to be executed in at least one processor of a computing device is stored. The computer-executable component obtains a voice from a plurality of voice output devices, selects a response device for a response to the voice among the plurality of voice output devices, and controls the response device to output a response related to the voice based on recognition state information of the voice recognized by the response device through a communication unit.

BRIEF DESCRIPTION OF THE DRAWINGS

The accompanying drawings, included as part of the detailed description in order to provide a thorough understanding of the present invention, provide embodiments of the present invention and together with the description, describe the technical features of the present invention.

FIG. 1 shows a block diagram of a wireless communication system to which methods proposed in the disclosure are applicable.

FIG. 2 shows an example of a signal transmission/reception method in a wireless communication system.

FIG. 3 shows an example of basic operations of an user equipment and a 5G network in a 5G communication system.

FIG. 4 shows an example of a schematic block diagram in which a text-to-speech (TTS) method according to an embodiment of the present invention is implemented.

FIG. 5 shows a block diagram of an AI device that may be applied to one embodiment of the present invention.

FIG. 6 shows an exemplary block diagram of a speech output apparatus according to an embodiment of the present invention.

FIG. 7 shows a schematic block diagram of a text-to-speech (TTS) device in a TTS system according to an embodiment of the present invention.

FIG. 8 shows a schematic block diagram of a TTS device in a TTS system environment according to an embodiment of the present invention.

FIG. 9 is a schematic block diagram of an AI processor capable of performing emotion classification information-based TTS according to an embodiment of the present invention.

FIG. 10 shows a voice output system according to an embodiment of the present invention.

FIG. 11 shows a voice output system according to another embodiment of the present invention.

FIG. 12 shows a flowchart showing voice output method according to an embodiment of the present invention.

FIG. 13 shows a detailed flowchart showing a voice output step (step S150 of FIG. 12) according to an embodiment of the present invention.

FIG. 14 shows a detailed flowchart showing a spoken distance determination step (step S151 of FIG. 13) according to an embodiment of the present invention.

FIG. 15 shows an example of a spoken distance determination and response intensity determination of FIG. 14.

FIG. 16 shows another example of the spoken distance determination and response intensity determination of FIG. 14.

FIG. 17 shows a detailed flowchart showing the step of determining a spoken distance when a response device fails in the recognition of a first voice.

FIG. 18 shows an example of the spoken distance determination of FIG. 17.

FIG. 19 shows a detailed flowchart showing the step of determining surrounding noise information (step S153 of FIG. 13) according to an embodiment of the present invention.

FIG. 20 shows an example of the surrounding noise information determination and response intensity determination of FIG. 19.

FIG. 21 shows a detailed flowchart showing the step of determining surrounding noise information when a response device fails in the recognition of a first voice.

FIG. 22 shows an example of the surrounding noise information determination and response intensity determination of FIG. 21.

FIG. 23 shows a detailed flowchart showing a process of obtaining estimated noise information and incorporating it into response intensity.

FIG. 24 shows a detailed block diagram of a deep learning model according to an embodiment of the present invention.

FIG. 25 shows recognition state information and operating state information according to an embodiment of the present invention.

DESCRIPTION OF EXEMPLARY EMBODIMENTS

Hereinafter, embodiments of the disclosure will be described in detail with reference to the attached drawings. The same or similar components are given the same reference numbers and redundant description thereof is omitted. The suffixes "module" and "unit" of elements herein are used for convenience of description and thus can be used interchangeably and do not have any distinguishable meanings or functions. Further, in the following description, if a detailed description of known techniques associated with the present invention would unnecessarily obscure the gist of the present invention, detailed description thereof will be omitted. In addition, the attached drawings are provided for easy understanding of embodiments of the disclosure and do not limit technical spirits of the disclosure, and the embodiments should be construed as including all modifications, equivalents, and alternatives falling within the spirit and scope of the embodiments.

While terms, such as "first", "second", etc., may be used to describe various components, such components must not be limited by the above terms. The above terms are used only to distinguish one component from another.

When an element is "coupled" or "connected" to another element, it should be understood that a third element may be present between the two elements although the element may be directly coupled or connected to the other element. When an element is "directly coupled" or "directly connected" to another element, it should be understood that no element is present between the two elements.

The singular forms are intended to include the plural forms as well, unless the context clearly indicates otherwise.

In addition, in the specification, it will be further understood that the terms "comprise" and "include" specify the presence of stated features, integers, steps, operations, elements, components, and/or combinations thereof, but do not preclude the presence or addition of one or more other features, integers, steps, operations, elements, components, and/or combinations.

Hereinafter, 5G communication (5th generation mobile communication) required by an apparatus requiring AI processed information and/or an AI processor will be described through paragraphs A through G.

A. EXAMPLE OF BLOCK DIAGRAM OF UE AND 5G NETWORK

FIG. 1 is a block diagram of a wireless communication system to which methods proposed in the disclosure are applicable.

Referring to FIG. 1, a device (AI device) including an AI module is defined as a first communication device (910 of FIG. 1), and a processor 911 can perform detailed AI operation.

A 5G network including another device (AI server) communicating with the AI device is defined as a second communication device (920 of FIG. 1), and a processor 921 can perform detailed AI operations.

The 5G network may be represented as the first communication device and the AI device may be represented as the second communication device.

For example, the first communication device or the second communication device may be a base station, a network node, a transmission terminal, a reception terminal, a wireless device, a wireless communication device, an autonomous device, or the like.

For example, the first communication device or the second communication device may be a base station, a network node, a transmission terminal, a reception terminal, a wireless device, a wireless communication device, a vehicle, a vehicle having an autonomous function, a connected car, a drone (Unmanned Aerial Vehicle, UAV), and AI (Artificial Intelligence) module, a robot, an AR (Augmented Reality) device, a VR (Virtual Reality) device, an MR (Mixed Reality) device, a hologram device, a public safety device, an MTC device, an IoT device, a medical device, a Fin Tech device (or financial device), a security device, a climate/environment device, a device associated with 5G services, or other devices associated with the fourth industrial revolution field.

For example, a terminal or user equipment (UE) may include a cellular phone, a smart phone, a laptop computer, a digital broadcast terminal, personal digital assistants (PDAs), a portable multimedia player (PMP), a navigation device, a slate PC, a tablet PC, an ultrabook, a wearable device (e.g., a smartwatch, a smart glass and a head mounted display (HMD)), etc. For example, the HMD may be a display device worn on the head of a user. For example, the HMD may be used to realize VR, AR or MR. For example, the drone may be a flying object that flies by wireless control signals without a person therein. For example, the VR device may include a device that implements objects or backgrounds of a virtual world. For example, the AR device may include a device that connects and implements objects or background of a virtual world to objects, backgrounds, or the like of a real world. For example, the MR device may include a device that unites and implements objects or background of a virtual world to objects, backgrounds, or the like of a real world. For example, the hologram device may include a device that implements 360-degree 3D images by recording and playing 3D information using the interference phenomenon of light that is generated by two lasers meeting each other which is called holography. For example, the public safety device may include an image repeater or an imaging device that can be worn on the body of a user. For example, the MTC device and the IoT device may be devices that do not require direct interference or operation by a person. For example, the MTC device and the IoT device may include a smart meter, a bending machine, a thermometer, a smart bulb, a door lock, various sensors, or the like. For example, the medical device may be a device that is used to diagnose, treat, attenuate, remove, or prevent diseases. For example, the medical device may be a device that is used to diagnose, treat, attenuate, or correct injuries or disorders. For example, the medial device may be a device that is used to examine, replace, or change structures or functions. For example, the medical device may be a device that is used to control pregnancy. For example, the medical device may include a device for medical treatment, a device for operations, a device for (external) diagnose, a hearing aid, an operation device, or the like. For example, the security device may be a device that is installed to prevent a danger that is likely to occur and to keep safety. For example, the security device may be a camera, a CCTV, a recorder, a black box, or the like. For example, the Fin Tech device may be a device that can provide financial services such as mobile payment.

Referring to FIG. 1, the first communication device 910 and the second communication device 920 include processors 911 and 921, memories 914 and 924, one or more Tx/Rx radio frequency (RF) modules 915 and 925, Tx processors 912 and 922, Rx processors 913 and 923, and antennas 916 and 926. The Tx/Rx module is also referred to as a transceiver. Each Tx/Rx module 915 transmits a signal through each antenna 926. The processor implements the aforementioned functions, processes and/or methods. The processor 921 may be related to the memory 924 that stores program code and data. The memory may be referred to as a computer-readable medium. More specifically, the Tx processor 912 implements various signal processing functions with respect to L1 (i.e., physical layer) in DL (communication from the first communication device to the second communication device). The Rx processor implements various signal processing functions of L1 (i.e., physical layer).

UL (communication from the second communication device to the first communication device) is processed in the first communication device 910 in a way similar to that described in association with a receiver function in the second communication device 920. Each Tx/Rx module 925 receives a signal through each antenna 926. Each Tx/Rx module provides RF carriers and information to the Rx processor 923. The processor 921 may be related to the memory 924 that stores program code and data. The memory may be referred to as a computer-readable medium.

B. SIGNAL TRANSMISSION/RECEPTION METHOD IN WIRELESS COMMUNICATION SYSTEM

FIG. 2 is a diagram showing an example of a signal transmission/reception method in a wireless communication system.

Referring to FIG. 2, when a UE is powered on or enters a new cell, the UE performs an initial cell search operation such as synchronization with a BS (S201). For this operation, the UE can receive a primary synchronization channel (P-SCH) and a secondary synchronization channel (S-SCH) from the BS to synchronize with the BS and obtain information such as a cell ID. In LTE and NR systems, the P-SCH and S-SCH are respectively called a primary synchronization signal (PSS) and a secondary synchronization signal (SSS). After initial cell search, the UE can obtain broadcast information in the cell by receiving a physical broadcast channel (PBCH) from the BS. Further, the UE can receive a downlink reference signal (DL RS) in the initial cell search step to check a downlink channel state. After initial cell search, the UE can obtain more detailed system information by receiving a physical downlink shared channel (PDSCH) according to a physical downlink control channel (PDCCH) and information included in the PDCCH (S202).

Meanwhile, when the UE initially accesses the BS or has no radio resource for signal transmission, the UE can perform a random access procedure (RACH) for the BS (steps S203 to S206). To this end, the UE can transmit a specific sequence as a preamble through a physical random access channel (PRACH) (S203 and S205) and receive a random access response (RAR) message for the preamble through a PDCCH and a corresponding PDSCH (S204 and S206). In the case of a contention-based RACH, a contention resolution procedure may be additionally performed.

After the UE performs the above-described process, the UE can perform PDCCH/PDSCH reception (S207) and physical uplink shared channel (PUSCH)/physical uplink control channel (PUCCH) transmission (S208) as normal uplink/downlink signal transmission processes. Particularly, the UE receives downlink control information (DCI) through the PDCCH. The UE monitors a set of PDCCH candidates in monitoring occasions set for one or more control element sets (CORESET) on a serving cell according to corresponding search space configurations. A set of PDCCH candidates to be monitored by the UE is defined in terms of search space sets, and a search space set may be a common search space set or a UE-specific search space set. CORESET includes a set of (physical) resource blocks having a duration of one to three OFDM symbols. A network can configure the UE such that the UE has a plurality of CORESETs. The UE monitors PDCCH candidates in one or more search space sets. Here, monitoring means attempting decoding of PDCCH candidate(s) in a search space. When the UE has successfully decoded one of PDCCH candidates in a search space, the UE determines that a PDCCH has been detected from the PDCCH candidate and performs PDSCH reception or PUSCH transmission on the basis of DCI in the detected PDCCH. The PDCCH can be used to schedule DL transmissions over a PDSCH and UL transmissions over a PUSCH. Here, the DCI in the PDCCH includes downlink assignment (i.e., downlink grant (DL grant)) related to a physical downlink shared channel and including at least a modulation and coding format and resource allocation information, or an uplink grant (UL grant) related to a physical uplink shared channel and including a modulation and coding format and resource allocation information.

An initial access (IA) procedure in a 5G communication system will be additionally described with reference to FIG. 2.

The UE can perform cell search, system information acquisition, beam alignment for initial access, and DL measurement on the basis of an SSB. The SSB is interchangeably used with a synchronization signal/physical broadcast channel (SS/PBCH) block.

The SSB includes a PSS, an SSS and a PBCH. The SSB is configured in four consecutive OFDM symbols, and a PSS, a PBCH, an SSS/PBCH or a PBCH is transmitted for each OFDM symbol. Each of the PSS and the SSS includes one OFDM symbol and 127 subcarriers, and the PBCH includes 3 OFDM symbols and 576 subcarriers.

Cell search refers to a process in which a UE obtains time/frequency synchronization of a cell and detects a cell identifier (ID) (e.g., physical layer cell ID (PCI)) of the cell. The PSS is used to detect a cell ID in a cell ID group and the SSS is used to detect a cell ID group. The PBCH is used to detect an SSB (time) index and a half-frame.

There are 336 cell ID groups and there are 3 cell IDs per cell ID group. A total of 1008 cell IDs are present. Information on a cell ID group to which a cell ID of a cell belongs is provided/obtained through an SSS of the cell, and information on the cell ID among 336 cell ID groups is provided/obtained through a PSS.

The SSB is periodically transmitted in accordance with SSB periodicity. A default SSB periodicity assumed by a UE during initial cell search is defined as 20 ms. After cell access, the SSB periodicity can be set to one of {5 ms, 10 ms, 20 ms, 40 ms, 80 ms, 160 ms} by a network (e.g., a BS).

Next, acquisition of system information (SI) will be described.

SI is divided into a master information block (MIB) and a plurality of system information blocks (SIBs). SI other than the MIB may be referred to as remaining minimum system information. The MIB includes information/parameter for monitoring a PDCCH that schedules a PDSCH carrying SIB1 (SystemInformationBlock1) and is transmitted by a BS through a PBCH of an SSB. SIB1 includes information related to availability and scheduling (e.g., transmission periodicity and SI-window size) of the remaining SIBs (hereinafter, SIBx, xis an integer equal to or greater than 2). SiBx is included in an SI message and transmitted over a PDSCH. Each SI message is transmitted within a periodically generated time window (i.e., SI-window).

A random access (RA) procedure in a 5G communication system will be additionally described with reference to FIG. 2.

A random access procedure is used for various purposes. For example, the random access procedure can be used for network initial access, handover, and UE-triggered UL data transmission. A UE can obtain UL synchronization and UL transmission resources through the random access procedure. The random access procedure is classified into a contention-based random access procedure and a contention-free random access procedure. A detailed procedure for the contention-based random access procedure is as follows.

A UE can transmit a random access preamble through a PRACH as Msg1 of a random access procedure in UL. Random access preamble sequences having different two lengths are supported. A long sequence length 839 is applied to subcarrier spacings of 1.25 kHz and 5 kHz and a short sequence length 139 is applied to subcarrier spacings of 15 kHz, 30 kHz, 60 kHz and 120 kHz.

When a BS receives the random access preamble from the UE, the BS transmits a random access response (RAR) message (Msg2) to the UE. A PDCCH that schedules a PDSCH carrying a RAR is CRC masked by a random access (RA) radio network temporary identifier (RNTI) (RA-RNTI) and transmitted. Upon detection of the PDCCH masked by the RA-RNTI, the UE can receive a RAR from the PDSCH scheduled by DCI carried by the PDCCH. The UE checks whether the RAR includes random access response information with respect to the preamble transmitted by the UE, that is, Msg1. Presence or absence of random access information with respect to Msg1 transmitted by the UE can be determined according to presence or absence of a random access preamble ID with respect to the preamble transmitted by the UE. If there is no response to Msg1, the UE can retransmit the RACH preamble less than a predetermined number of times while performing power ramping. The UE calculates PRACH transmission power for preamble retransmission on the basis of most recent pathloss and a power ramping counter.

The UE can perform UL transmission through Msg3 of the random access procedure over a physical uplink shared channel on the basis of the random access response information. Msg3 can include an RRC connection request and a UE ID. The network can transmit Msg4 as a response to Msg3, and Msg4 can be handled as a contention resolution message on DL. The UE can enter an RRC connected state by receiving Msg4.

C. BEAM MANAGEMENT (BM) PROCEDURE OF 5G COMMUNICATION SYSTEM

A BM procedure can be divided into (1) a DL MB procedure using an SSB or a CSI-RS and (2) a UL BM procedure using a sounding reference signal (SRS). In addition, each BM procedure can include Tx beam swiping for determining a Tx beam and Rx beam swiping for determining an Rx beam.

The DL BM procedure using an SSB will be described.

Configuration of a beam report using an SSB is performed when channel state information (CSI)/beam is configured in RRC_CONNECTED.

- A UE receives a CSI-ResourceConfig IE including CSI-SSB-ResourceSetList for SSB resources used for BM from a BS. The RRC parameter "csi-SSB-Resource-SetList" represents a list of SSB resources used for beam management and report in one resource set. Here, an SSB resource set can be set as {SSBx1, SSBx2, SSBx3, SSBx4, . . . }. An SSB index can be defined in the range of 0 to 63.
- The UE receives the signals on SSB resources from the BS on the basis of the CSI-SSB-ResourceSetList.
- When CSI-RS reportConfig with respect to a report on SSBRI and reference signal received power (RSRP) is set, the UE reports the best SSBRI and RSRP corresponding thereto to the BS. For example, when reportQuantity of the CSI-RS reportConfig IE is set to 'ssb-Index-RSRP', the UE reports the best SSBRI and RSRP corresponding thereto to the BS.

When a CSI-RS resource is configured in the same OFDM symbols as an SSB and 'QCL-TypeD' is applicable, the UE can assume that the CSI-RS and the SSB are quasi co-located (QCL) from the viewpoint of 'QCL-TypeD'. Here, QCL-TypeD may mean that antenna ports are quasi co-located from the viewpoint of a spatial Rx parameter. When the UE receives signals of a plurality of DL antenna ports in a QCL-TypeD relationship, the same Rx beam can be applied.

Next, a DL BM procedure using a CSI-RS will be described.

An Rx beam determination (or refinement) procedure of a UE and a Tx beam swiping procedure of a BS using a CSI-RS will be sequentially described. A repetition parameter is set to 'ON' in the Rx beam determination procedure of a UE and set to 'OFF' in the Tx beam swiping procedure of a BS.

First, the Rx beam determination procedure of a UE will be described.

- The UE receives an NZP CSI-RS resource set IE including an RRC parameter with respect to 'repetition' from a BS through RRC signaling. Here, the RRC parameter 'repetition' is set to 'ON'.
- The UE repeatedly receives signals on resources in a CSI-RS resource set in which the RRC parameter 'repetition' is set to 'ON' in different OFDM symbols through the same Tx beam (or DL spatial domain transmission filters) of the BS.
- The UE determines an RX beam thereof.
- The UE skips a CSI report. That is, the UE can skip a CSI report when the RRC parameter 'repetition' is set to 'ON'.

Next, the Tx beam determination procedure of a BS will be described.

- A UE receives an NZP CSI-RS resource set IE including an RRC parameter with respect to 'repetition' from the BS through RRC signaling. Here, the RRC parameter 'repetition' is related to the Tx beam swiping procedure of the BS when set to 'OFF'.
- The UE receives signals on resources in a CSI-RS resource set in which the RRC parameter 'repetition' is set to 'OFF' in different DL spatial domain transmission filters of the BS.
- The UE selects (or determines) a best beam.
- The UE reports an ID (e.g., CRI) of the selected beam and related quality information (e.g., RSRP) to the BS. That is, when a CSI-RS is transmitted for BM, the UE reports a CRI and RSRP with respect thereto to the BS.

Next, the UL BM procedure using an SRS will be described.

- A UE receives RRC signaling (e.g., SRS-Config IE) including a (RRC parameter) purpose parameter set to 'beam management" from a BS. The SRS-Config IE is used to set SRS transmission. The SRS-Config IE includes a list of SRS-Resources and a list of SRS-ResourceSets. Each SRS resource set refers to a set of SRS-resources.
- The UE determines Tx beamforming for SRS resources to be transmitted on the basis of SRS-SpatialRelation Info included in the SRS-Config IE. Here, SRS-SpatialRelation Info is set for each SRS resource and indicates whether the same beamforming as that used for an SSB, a CSI-RS or an SRS will be applied for each SRS resource.
  - When SRS-SpatialRelationInfo is set for SRS resources, the same beamforming as that used for the SSB, CSI-RS or SRS is applied. However, when SRS-SpatialRelationInfo is not set for SRS resources, the UE arbitrarily determines Tx beamforming and transmits an SRS through the determined Tx beamforming.

Next, a beam failure recovery (BFR) procedure will be described.

In a beamformed system, radio link failure (RLF) may frequently occur due to rotation, movement or beamforming blockage of a UE. Accordingly, NR supports BFR in order to prevent frequent occurrence of RLF. BFR is similar to a radio link failure recovery procedure and can be supported when a UE knows new candidate beams. For beam failure detection, a BS configures beam failure detection reference signals for a UE, and the UE declares beam failure when the number of beam failure indications from the physical layer of the UE reaches a threshold set through RRC signaling within a period set through RRC signaling of the BS. After beam failure detection, the UE triggers beam failure recovery by initiating a random access procedure in a PCell and performs beam failure recovery by selecting a suitable beam. (When the BS provides dedicated random access resources for certain beams, these are prioritized by the UE). Completion of the aforementioned random access procedure is regarded as completion of beam failure recovery.

D. URLLC (ULTRA-RELIABLE AND LOW LATENCY COMMUNICATION)

URLLC transmission defined in NR can refer to (1) a relatively low traffic size, (2) a relatively low arrival rate, (3) extremely low latency requirements (e.g., 0.5 and 1 ms), (4) relatively short transmission duration (e.g., 2 OFDM symbols), (5) urgent services/messages, etc. In the case of UL, transmission of traffic of a specific type (e.g., URLLC) needs to be multiplexed with another transmission (e.g., eMBB) scheduled in advance in order to satisfy more stringent latency requirements. In this regard, a method of providing information indicating preemption of specific resources to a UE scheduled in advance and allowing a URLLC UE to use the resources for UL transmission is provided.

NR supports dynamic resource sharing between eMBB and URLLC. eMBB and URLLC services can be scheduled on non-overlapping time/frequency resources, and URLLC transmission can occur in resources scheduled for ongoing eMBB traffic. An eMBB UE may not ascertain whether PDSCH transmission of the corresponding UE has been partially punctured and the UE may not decode a PDSCH due to corrupted coded bits. In view of this, NR provides a preemption indication. The preemption indication may also be referred to as an interrupted transmission indication.

With regard to the preemption indication, a UE receives DownlinkPreemption IE through RRC signaling from a BS. When the UE is provided with DownlinkPreemption IE, the UE is configured with INT-RNTI provided by a parameter int-RNTI in DownlinkPreemption IE for monitoring of a PDCCH that conveys DCI format 2_1. The UE is additionally configured with a corresponding set of positions for fields in DCI format 2_1 according to a set of serving cells and positionInDCI by INT-ConfigurationPerServing Cell including a set of serving cell indexes provided by serving-CellID, configured having an information payload size for DCI format 2_1 according to dci-Payloadsize, and configured with indication granularity of time-frequency resources according to timeFrequencySect.

The UE receives DCI format 2_1 from the BS on the basis of the DownlinkPreemption IE.

When the UE detects DCI format 2_1 for a serving cell in a configured set of serving cells, the UE can assume that there is no transmission to the UE in PRBs and symbols indicated by the DCI format 2_1 in a set of PRBs and a set of symbols in a last monitoring period before a monitoring period to which the DCI format 2_1 belongs. For example, the UE assumes that a signal in a time-frequency resource indicated according to preemption is not DL transmission scheduled therefor and decodes data on the basis of signals received in the remaining resource region.

E. mMTC (MASSIVE MTC)

mMTC (massive Machine Type Communication) is one of 5G scenarios for supporting a hyper-connection service providing simultaneous communication with a large number of UEs. In this environment, a UE intermittently performs communication with a very low speed and mobility. Accordingly, a main goal of mMTC is operating a UE for a long time at a low cost. With respect to mMTC, 3GPP deals with MTC and NB (NarrowBand)-IoT.

mMTC has features such as repetitive transmission of a PDCCH, a PUCCH, a PDSCH (physical downlink shared channel), a PUSCH, etc., frequency hopping, retuning, and a guard period.

That is, a PUSCH (or a PUCCH (particularly, a long PUCCH) or a PRACH) including specific information and a PDSCH (or a PDCCH) including a response to the specific information are repeatedly transmitted. Repetitive transmission is performed through frequency hopping, and for repetitive transmission, (RF) retuning from a first frequency resource to a second frequency resource is performed in a guard period and the specific information and the response to the specific information can be transmitted/received through a narrowband (e.g., 6 resource blocks (RBs) or 1 RB).

F. BASIC OPERATION OF AI PROCESSING USING 5G COMMUNICATION

FIG. 3 shows an example of basic operations of AI processing in a 5G communication system.

The UE transmits specific information to the 5G network (S1). The 5G network may perform 5G processing related to the specific information (S2). Here, the 5G processing may include AI processing. And the 5G network may transmit response including AI processing result to UE(S3).

G. APPLIED OPERATIONS BETWEEN UE AND 5G NETWORK IN 5G COMMUNICATION SYSTEM

Hereinafter, the operation of an autonomous vehicle using 5G communication will be described in more detail with reference to wireless communication technology (BM procedure, URLLC, mMTC, etc.) described in FIGS. 1 and 2.

First, a basic procedure of an applied operation to which a method proposed by the present invention which will be described later and eMBB of 5G communication are applied will be described.

As in steps S1 and S3 of FIG. 3, the autonomous vehicle performs an initial access procedure and a random access procedure with the 5G network prior to step S1 of FIG. 3 in order to transmit/receive signals, information and the like to/from the 5G network.

More specifically, the autonomous vehicle performs an initial access procedure with the 5G network on the basis of an SSB in order to obtain DL synchronization and system information. A beam management (BM) procedure and a beam failure recovery procedure may be added in the initial access procedure, and quasi-co-location (QCL) relation may be added in a process in which the autonomous vehicle receives a signal from the 5G network.

In addition, the autonomous vehicle performs a random access procedure with the 5G network for UL synchronization acquisition and/or UL transmission. The 5G network can transmit, to the autonomous vehicle, a UL grant for scheduling transmission of specific information. Accordingly, the autonomous vehicle transmits the specific information to the 5G network on the basis of the UL grant. In addition, the 5G network transmits, to the autonomous vehicle, a DL grant for scheduling transmission of 5G processing results with respect to the specific information. Accordingly, the 5G network can transmit, to the autonomous vehicle, information (or a signal) related to remote control on the basis of the DL grant.

Next, a basic procedure of an applied operation to which a method proposed by the present invention which will be described later and URLLC of 5G communication are applied will be described.

As described above, an autonomous vehicle can receive DownlinkPreemption IE from the 5G network after the autonomous vehicle performs an initial access procedure and/or a random access procedure with the 5G network. Then, the autonomous vehicle receives DCI format 2_1 including a preemption indication from the 5G network on the basis of DownlinkPreemption IE. The autonomous vehicle does not perform (or expect or assume) reception of eMBB data in resources (PRBs and/or OFDM symbols) indicated by the preemption indication. Thereafter, when the autonomous vehicle needs to transmit specific information, the autonomous vehicle can receive a UL grant from the 5G network.

Next, a basic procedure of an applied operation to which a method proposed by the present invention which will be described later and mMTC of 5G communication are applied will be described.

Description will focus on parts in the steps of FIG. 3 which are changed according to application of mMTC.

In step S1 of FIG. 3, the autonomous vehicle receives a UL grant from the 5G network in order to transmit specific information to the 5G network. Here, the UL grant may include information on the number of repetitions of transmission of the specific information and the specific information may be repeatedly transmitted on the basis of the information on the number of repetitions. That is, the autonomous vehicle transmits the specific information to the 5G network on the basis of the UL grant. Repetitive transmission of the specific information may be performed through frequency hopping, the first transmission of the specific information may be performed in a first frequency resource, and the second transmission of the specific information may be performed in a second frequency resource. The specific information can be transmitted through a narrowband of 6 resource blocks (RBs) or 1 RB.

The above-described 5G communication technology can be combined with methods proposed in the present invention which will be described later and applied or can complement the methods proposed in the present invention to make technical features of the methods concrete and clear.

H. VOICE OUTPUT SYSTEM AND AI PROCESSING

FIG. 4 illustrates a block diagram of a schematic system in which a voice output method is implemented according to an embodiment of the present invention.

Referring to FIG. 4, a system in which a voice output method is implemented according to an embodiment of the present invention may include as a voice output apparatus 10, a network system 16, and a text-to-to-speech (TTS) system as a speech synthesis engine.

The at least one voice output device 10 may include a mobile phone 11, a PC 12, a notebook computer 13, and other server devices 14. The PC 12 and notebook computer 13 may connect to at least one network system 16 via a wireless access point 15. According to an embodiment of the present invention, the voice output apparatus 10 may include an audio book and a smart speaker.

Meanwhile, the TTS system 18 may be implemented in a server included in a network, or may be implemented by on-device processing and embedded in the voice output device 10. In the exemplary embodiment of the present invention, it is assumed that the TTS system 18 is implemented in the voice output device 10.

FIG. 5 shows a block diagram of an AI device that may be applied to one embodiment of the present invention.

The AI device 20 may include an electronic device including an AI module capable of performing AI processing or a server including the AI module. In addition, the AI device 20 may be included in at least a part of the voice output device 10 illustrated in FIG. 4 and may be provided to perform at least some of the AI processing together.

The AI processing may include all operations related to the voice output of the voice output device 10 shown in FIG. 5. For example, the AI processing may be a process of obtaining estimated noise information by analyzing the operating state of the voice output device 10.

The AI device 20 may include an AI processor 21, a memory 25, and/or a communication unit 27.

The AI device 20 is a computing device capable of learning neural networks, and may be implemented as various electronic devices such as a server, a desktop PC, a notebook PC, a tablet PC, and the like.

The AI processor 21 may learn a neural network using a program stored in the memory 25.

In particular, the AI processor 21 may learn a neural network for obtaining estimated noise information by analyzing the operating state of each voice output device. In this case, the neural network for outputting estimated noise information may be designed to simulate the human's brain structure on a computer, and may include a plurality of network nodes having weight and simulating the neurons of the human's neural network.

The plurality of network nodes can transmit and receive data in accordance with each connection relationship to simulate the synaptic activity of neurons in which neurons transmit and receive signals through synapses. Here, the neural network may include a deep learning model developed from a neural network model. In the deep learning model, a plurality of network nodes is positioned in different layers and can transmit and receive data in accordance with a convolution connection relationship. The neural network, for example, includes various deep learning techniques such as deep neural networks (DNN), convolutional deep neural networks (CNN), recurrent neural networks (RNN), a restricted boltzmann machine (RBM), deep belief networks (DBN), and a deep Q-network, and can be applied to fields such as computer vision, voice output, natural language processing, and voice/signal processing.

Meanwhile, a processor that performs the functions described above may be a general purpose processor (e.g., a CPU), but may be an AI-only processor (e.g., a GPU) for artificial intelligence learning.

The memory 25 can store various programs and data for the operation of the AI device 20. The memory 25 may be a nonvolatile memory, a volatile memory, a flash-memory, a hard disk drive (HDD), a solid state drive (SDD), or the like. The memory 25 is accessed by the AI processor 21 and reading-out/recording/correcting/deleting/updating, etc. of data by the AI processor 21 can be performed. Further, the memory 25 can store a neural network model (e.g., a deep learning model 26) generated through a learning algorithm for data classification/recognition according to an embodiment of the present invention.

Meanwhile, the AI processor 21 may include a data learning unit 22 that learns a neural network for data classification/recognition. The data learning unit 22 can learn references about what learning data are used and how to classify and recognize data using the learning data in order to determine data classification/recognition. The data learning unit 22 can learn a deep learning model by obtaining learning data to be used for learning and by applying the obtained learning data to the deep learning model.

The data learning unit 22 may be manufactured in the type of at least one hardware chip and mounted on the AI device 20. For example, the data learning unit 22 may be manufactured in a hardware chip type only for artificial intelligence, and may be manufactured as a part of a general purpose processor (CPU) or a graphics processing unit (GPU) and mounted on the AI device 20. Further, the data learning unit 22 may be implemented as a software module. When the data leaning unit 22 is implemented as a software module (or a program module including instructions), the software module may be stored in non-transitory computer readable media that can be read through a computer. In this case, at least one software module may be provided by an OS (operating system) or may be provided by an application.

The data learning unit 22 may include a learning data obtaining unit 23 and a model learning unit 24.

The learning data acquisition unit 23 may obtain training data for a neural network model for classifying and recognizing data. For example, the learning data acquisition unit 23 may obtain an operating state to be input to the neural network model and/or a feature value, extracted from the operating state, as the training data.

The model learning unit 24 can perform learning such that a neural network model has a determination reference about how to classify predetermined data, using the obtained learning data. In this case, the model learning unit 24 can train a neural network model through supervised learning that uses at least some of learning data as a determination reference. Alternatively, the model learning data 24 can train a neural network model through unsupervised learning that finds out a determination reference by performing learning by itself using learning data without supervision. Further, the model learning unit 24 can train a neural network model through reinforcement learning using feedback about whether the result of situation determination according to learning is correct. Further, the model learning unit 24 can train a neural network model using a learning algorithm including error back-propagation or gradient decent.

When a neural network model is learned, the model learning unit 24 can store the learned neural network model in the memory. The model learning unit 24 may store the learned neural network model in the memory of a server connected with the AI device 20 through a wire or wireless network.

The data learning unit 22 may further include a learning data preprocessor (not shown) and a learning data selector (not shown) to improve the analysis result of a recognition model or reduce resources or time for generating a recognition model.

The training data preprocessor may pre-process an obtained operating state so that the obtained operating state may be used for training for recognizing estimated noise information. For example, the training data preprocessor may process an obtained operating state in a preset format so that the model training unit 24 may use obtained training data for training for recognizing estimated noise information.

Furthermore, the training data selection unit may select data for training among training data obtained by the learning data acquisition unit 23 or training data pre-processed by the preprocessor. The selected training data may be provided to the model training unit 24. For example, the training data selection unit may select only data for a syllable, included in a specific region, as training data by detecting the specific region in the feature values of an operating state obtained by the voice output device 10.

Further, the data learning unit 22 may further include a model estimator (not shown) to improve the analysis result of a neural network model.

The model estimator inputs estimation data to a neural network model, and when an analysis result output from the estimation data does not satisfy a predetermined reference, it can make the model learning unit 22 perform learning again. In this case, the estimation data may be data defined in advance for estimating a recognition model. For example, when the number or ratio of estimation data with an incorrect analysis result of the analysis result of a recognition model learned with respect to estimation data exceeds a predetermined threshold, the model estimator can estimate that a predetermined reference is not satisfied.

The communication unit 27 can transmit the AI processing result by the AI processor 21 to an external electronic device.

Here, the external electronic device may be defined as an autonomous vehicle. Further, the AI device 20 may be defined as another vehicle or a 5G network that communicates with the autonomous vehicle. Meanwhile, the AI device 20 may be implemented by being functionally embedded in an autonomous module included in a vehicle. Further, the 5G network may include a server or a module that performs control related to autonomous driving.

Meanwhile, the AI device 20 shown in FIG. 5 was functionally separately described into the AI processor 21, the memory 25, the communication unit 27, etc., but it should be noted that the aforementioned components may be integrated in one module and referred to as an AI module.

FIG. 6 is an exemplary block diagram of a voice output apparatus according to an embodiment of the present invention.

One embodiment of the present invention may include computer readable and computer executable instructions that may be included in the voice output apparatus 10. Although FIG. 6 discloses a plurality of components included in the voice output apparatus 10, the components not disclosed may be included in the voice output apparatus 10.

A plurality of voice output apparatuses may be applied to one voice output apparatus. In such a multi-device system the voice output apparatus may comprise different components for performing various aspects of voice output processing. The voice output apparatus 10 shown in FIG. 6 is exemplary and may be an independent apparatus or may be implemented as a component of a larger apparatus or system.

One embodiment of the present invention may be applied to a plurality of different devices and computer systems, for example, a general purpose computing system, a server-client computing system, a telephone computing system, a laptop computer, a portable terminal, a PDA, a tablet computer, and the like. The voice output device 10 may also be applied to one component of another device or system that provides voice output such as automated teller machines (ATMs), kiosks, global positioning systems (GPS), home appliances (eg, refrigerators, ovens, washing machines, etc.), vehicles (vehicles), e-book readers.

As shown in FIG. 6, the voice output apparatus 10 includes a communication unit 110, an input unit 120, an output unit 130, a memory 140, a sensing unit 150, an interface unit 160, and a power supply unit 190 and/or processor 170. On the other hand, some of the components disclosed in the voice output apparatus 10 may appear as a single component several times in one device.

The voice output apparatus 10 may include an address/data bus (not shown) for transferring data between the components of the voice output apparatus 10. Each component in the voice output apparatus 10 may be directly connected to other components through the bus (not shown). Meanwhile, each component in the voice output apparatus 10 may be directly connected to the processor 170.

More specifically, the communication unit 110 may include one or more modules that enable communication between the above components, wireless communication between the electronic device 10 and the wireless communication system, between the electronic device 10 and another electronic device, or between the electronic device 10 and an external server. In addition, the communication unit 110 may include one or more modules for connecting the electronic device 10 to one or more networks.

The communication unit 110 may be a wireless communication device such as a radio frequency (RF), an infrared (Infrared), Bluetooth, a wireless local area network (WLAN) (Wi-Fi, etc.) or 5G network, a Long Term Evolution (LTE) network, wireless network wireless devices such as WiMAN networks, 3G networks.

The communication unit 110 may include at least one of a broadcast receiving module, a mobile communication module, a wireless internet module, a short range communication module, and a location information module.

The input unit 120 may include a microphone, a touch input unit, a keyboard, a mouse, a stylus, or another input unit.

In addition, the input unit 120 may include a camera or an image input unit for inputting an image signal, a microphone or an audio input unit for inputting an audio signal, and a user input unit (eg, a touch key, push key (mechanical key, etc.)) for receiving information from a user. The voice data or the image data collected by the input unit 120 may be analyzed and processed as a control command of the user.

The sensing unit 150 may include one or more sensors for sensing at least one of information in the electronic device 10, surrounding environment information surrounding the electronic device 10, and user information.

For example, the sensing unit 150 may include at least one of a proximity sensor, an illumination sensor, a touch sensor, an acceleration sensor, a magnetic sensor, and a gravity sensor (G-sensor), gyroscope sensor, motion sensor, RGB sensor, infrared sensor (IR sensor), fingerprint scan sensor, ultrasonic sensor, optical sensor (e.g., imaging means), microphones, battery gauges, environmental sensors (e.g. barometers, hygrometers, thermometers, radiation sensors, heat sensors, gas sensors, etc.), a chemical sensor (eg, electronic nose, healthcare sensor, biometric sensor, etc.). Meanwhile, the electronic device 10 disclosed herein may use a combination of information sensed by at least two or more of these sensors.

The output unit 130 may output information (for example, voice) processed by the voice output device 10 or another device. The output unit 130 may include a speaker, a headphone, or other suitable component for propagating voice. As another example, the output unit 130 may include an audio output unit. In addition, the output unit 130 may include a display (visual display or tactile display), audio speakers, headphones, printer or other output unit. The output unit 130 may be integrated into the voice output apparatus 10 or may be implemented separately from the voice output apparatus 10.

The output unit 130 is used to generate an output related to visual, auditory or tactile, and may include at least one of a display unit, an audio output unit, a hap tip module, and an optical output unit. The display unit may form a layer structure or an integrated structure with the touch sensor, thereby implementing a touch screen. Such a touch screen may serve as a user input means for providing an input interface between the augmented reality electronic device 10 and the user, and at the same time, provide an output interface between the augmented reality electronic device 10 and the user.

Input 120 and/or output 130 may also include an interface for connecting external peripherals such as Universal Serial Bus (USB), FireWire, Thunderbolt or other connection protocols. Input 120 and/or output 130 may also include a network connection, such as an Ethernet port, modem, or the like. The voice output apparatus 10 may be connected to the Internet or a distributed computing environment through the input unit 120 and/or the output unit 130. In addition, the voice output apparatus 10 may be connected to a removable or external memory (eg, a removable memory card, a memory key drive, a network storage, etc.) through the input unit 120 or the output unit 130.

The interface unit 160 serves as a path to various types of external devices connected to the electronic device 10. The electronic device 10 may receive virtual reality or augmented reality content from an external device through the interface unit 160, and may interact with each other by exchanging various input signals, sensing signals, and data.

For example, the interface unit 160 may include a device equipped with a wired/wireless headset port, an external charger port, a wired/wireless data port, a memory card port, and an identification module. It may include at least one of a port connecting, an audio input/output (I/O) port, a video input/output (I/O) port, and an earphone port. The memory 140 may store data and instructions. The memory 140 may include a magnetic storage, an optical storage, a solid-state storage type, and the like.

The memory 140 may include volatile RAM, nonvolatile ROM, or another type of memory.

In addition, the memory 140 stores data supporting various functions of the electronic device 10. The memory 140 may store a plurality of application programs or applications that are driven in the electronic device 10, data for operating the electronic device 10, and instructions. At least some of these applications may be downloaded from an external server via wireless communication. At least some of these application programs may be present on the electronic device 10 from the time of shipment for the basic functions of the electronic device 10 (for example, a call forwarding, a calling function, a message receiving, and a calling function).

The voice output apparatus 10 may include a processor 170. The processor 170 may be connected to a bus (not shown), an input unit 120, an output unit 130, and/or other components of the voice output device 10. The processor 170 may correspond to a CPU for processing data, a computer readable instruction for processing data, and a memory for storing data and instructions.

In addition to the operations associated with the application, the processor 170 also typically controls the overall operation of the electronic device 10. The processor 170 may process signals, data, information, and the like, which are input or output through the above-described components.

In addition, the processor 170 may control at least some of the components by driving an application program stored in the memory 140 to provide appropriate information to the user or to process a function. In addition, the processor 170 may operate at least two or more of the components included in the electronic device 10 in combination with each other to drive an application program.

In addition, the processor 170 may detect the movement of the electronic device 10 or the user by using a gyroscope sensor, a gravity sensor, a motion sensor, or the like included in the sensing unit 150. Alternatively, the processor 170 may detect an object approaching to the electronic device 10 or the user by using a proximity sensor, an illumination sensor, a magnetic sensor, an infrared sensor, an ultrasonic sensor, an optical sensor, etc. included in the sensing unit 150. In addition, the processor 170 may detect a user's movement through sensors provided in a controller that operates in conjunction with the electronic device 10.

In addition, the processor 170 may perform an operation (or function) of the electronic device 10 using an application program stored in the memory 140.

Computer instructions to be processed in the processor 170 for operating the voice output apparatus 10 and various components may be executed by the processor 170 and may include a memory 140, an external device, or a processor to be described later. It may be stored in the memory or storage included in (170). Alternatively, all or some of the executable instructions may be embedded in hardware or firmware in addition to software. One embodiment of the invention may be implemented in various combinations of software, firmware and/or hardware, for example.

In detail, the processor 170 may process the text data into an audio waveform including voice, or may process the audio waveform into text data. The source of the textual data may be generated by an internal component of the voice output apparatus 10. In addition, the source of the text data may be received from the input unit such as a keyboard or transmitted to the voice output apparatus 10 through a network connection. The text may be in the form of sentences that include text, numbers, and/or punctuation for conversion by the processor 170 into speech. The input text may also include a special annotation for processing by the processor 170, and may indicate how the specific text should be pronounced through the special annotation. The text data may be processed in real time or later stored and processed.

In addition, although not shown in FIG. 6, the processor 170 may include a front end, a speech synthesis engine, and a TTS storage. The preprocessor may convert the input test data into a symbolic linguistic representation for processing by the speech synthesis engine. The speech synthesis engine may convert the input text into speech by comparing annotated phonetic units models with information stored in the TTS storage. The preprocessor and the speech synthesis engine may include an embedded internal processor or memory, or may use the processor 170 and the memory 140 included in the voice output apparatus 10. Instructions for operating the preprocessor and the speech synthesis engine may be included in the processor 170, the memory 140 of the voice output apparatus 10, or an external device.

Text input to the processor 170 may be sent to the preprocessor for processing. The preprocessor may include a module for performing text normalization, linguistic analysis, and linguistic prosody generation.

During the text normalization operation, the preprocessor processes the text input and generates standard text, converting numbers, abbreviations, and symbols the same as they are written.

During the language analysis operation, the preprocessor may analyze the language of the normalized text to generate a series of phonetic units corresponding to the input text. This process may be called phonetic transcription.

Phonetic units are finally combined to include symbolic representations of sound units output by the voice output device 10 as speech. Various sound units can be used to segment text for speech synthesis.

Processor 170 includes phonemes (individual sounds), half-phonemes, di-phones (the last half of a phoneme combined with the first half of adjacent phonemes) and bi-phones. Speech can be processed based on two successive sonic speeds, syllables, words, phrases, sentences, or other units. Each word may be mapped to one or more phonetic units. Such mapping may be performed using a language dictionary stored in the voice output apparatus 10.

Linguistic analysis performed by the preprocessor may also involve identifying different grammatical elements, such as prefixes, suffixes, phrases, punctuation, and syntactic boundaries. Such grammatical components can be used by the processor 170 to produce natural audio waveform output. The language dictionary may also include letter-to-sound rules and other tools that may be used to pronounce previously unverified words or letter combinations that may be generated by the processor 170. In general, the more information included in the language dictionary, the higher the quality of voice output can be guaranteed.

Based on the language analysis, the preprocessor may perform language rhythm generation annotated to phonetic units with prosodic characteristics indicating how the final sound unit should be pronounced in the final output speech.

The rhyme characteristics may also be referred to as acoustic features. During the operation of this step, the preprocessor may integrate into the processor 170 taking into account any prosodic annotations involving text input. Such acoustic features may include pitch, energy, duration, and the like. Application of the acoustic feature may be based on prosodic models available to the processor 170.

This rhyme model represents how phonetic units should be pronounced in certain situations. For example, a rhyme model can include a phoneme's position in a syllable, a syllable's position in a word, or a word's position in a sentence or phrase, phrases neighboring phonetic units, and the like. Like the language dictionary, the more information of the prosodic model, the higher the quality of voice output can be guaranteed.

The output of the preprocessor may include a series of speech units annotated with prosodic characteristics. The output of the preprocessor may be referred to as a symbolic linguistic representation. The symbolic language representation may be sent to a speech synthesis engine.

The speech synthesis engine performs a process of converting a speech into an audio waveform for output to the user through the output unit 130. The speech synthesis engine may be configured to convert the input text into high quality natural speech in an efficient manner. Such high quality speech can be configured to pronounce as much as possible a human speaker.

The speech synthesis engine may perform speech synthesis using at least one other method.

The Unit Selection Engine contrasts a recorded speech database with a symbolic linguistic representation generated by the preprocessor. The unit selection engine matches the symbol language representation with the speech audio unit of the speech database. Matching units can be selected to form a speech output and the selected matching units can be connected together. Each unit has only an audio waveform corresponding to a phonetic unit, such as a short .wav file of a particular sound, with a description of the various acoustic characteristics associated with the .wav file (pitch, energy, etc.). In addition, the speech unit may include other information such as a word, a sentence or a phrase, a location displayed on a neighboring speech unit.

The unit selection engine can match the input text using all the information in the unit database to produce a natural waveform. The unit database may include an example of a number of speech units that provide different options to the voice output device 10 for connecting the units in speech. One of the advantages of unit selection is that natural voice output can be produced depending on the size of the database. In addition, as the unit database is larger, the voice output apparatus 10 may configure natural speech.

On the other hand, there is a parameter synthesis method in addition to the above-described unit selection synthesis. Parametric synthesis allows synthesis parameters such as frequency, volume and noise to be modified by a parametric synthesis engine, a digital signal processor, or other audio generating device to produce an artificial speech waveform.

Parametric synthesis can be matched to a desired linguistic representation desired output speech parameter using an acoustic model and various statistical techniques. Parameter synthesis not only processes speech without the large database associated with unit selection, but also enables accurate processing at high processing speeds. The unit selection synthesis method and the parameter synthesis method may be performed separately or in combination to generate a voice audio output.

Parametric speech synthesis may be performed as follows. The processor 170 may include an acoustic model capable of converting a symbolic linguistic representation into a synthetic acoustic waveform of the text input based on the audio signal manipulation. The acoustic model may include rules that may be used by the parameter synthesis engine to assign specific audio waveform parameters to input speech units and/or prosodic annotations. The rule can be used to calculate a score indicating the likelihood that a particular audio output parameter (frequency, volume, etc.) corresponds to the portion of the input symbolic language representation from the preprocessor.

The parametric synthesis engine may apply a plurality of techniques to match the voice to be synthesized with the input speech unit and/or the rhyme annotation. One common technique uses the Hidden Markov Model (HMM), which can be used to determine the probability that an audio output should match text input. The HMM can be used to convert the parameters of language and acoustic space into parameters to be used by a vocoder (digital voice encoder) to artificially synthesize the desired speech.

The voice output apparatus 10 may also include a speech unit database for use in unit selection. The voice unit database may be stored in memory 140 or other storage configuration. The voice unit database may include recorded speech utterance. The speech utterance may be text corresponding to the speech content. In addition, the speech unit database may include recorded speech (in the form of audio waveforms, feature vectors or other formats) that takes up significant storage space in the voice output device 10. Unit samples of the speech unit database may be classified in a variety of ways, including speech units (phonemes, diphonies, words, etc.), linguistic rhyme labels, sound feature sequences, speaker identities, and the like. Sample utterance can be used to generate a mathematical model corresponding to the desired audio output for a particular speech unit.

When the speech synthesis engine matches the symbolic language representation, it may select a unit in the speech unit database that most closely matches the input text (including both speech units and rhythm annotations). In general, the larger the voice unit database, the greater the number of selectable unit samples, thus enabling accurate speech output.

The processor 170 may transmit audio waveforms including audio output to the output unit 130 for output to the user. The processor 170 may store the audio waveform including speech in the memory 140 in a plurality of different formats, such as a series of feature vectors, uncompressed audio data, or compressed audio data. For example, processor 170 may encode and/or compress voice output using an encoder/decoder prior to the transmission. The encoder/decoder may encode and decode audio data such as digitized audio data, feature vectors, and the like. In addition, the functions of the encoder/decoder may be located in separate components or may be performed by the processor 170.

The memory 140 may store other information for voice output. The contents of memory 140 may be prepared for general voice output and TTS use, and may be customized to include sounds and words that are likely to be used in a particular application. For example, the TTS storage may include customized voice specialized for location and navigation for TTS processing by the GPS device.

The memory 140 may also be customized to the user based on the personalized desired voice output. For example, a user may prefer a voice that is output to a specific gender, a specific intonation, a specific speed, a specific emotion (eg, a happy voice). The speech synthesis engine may include a specialized database or model to describe such user preferences.

The voice output apparatus 10 may also be configured to perform TTS processing in multiple languages. For each language, processor 170 may include data, instructions, and/or components specifically configured to synthesize speech in a desired language.

The processor 170 may modify or update the contents of the memory 140 based on the feedback on the result of the TTS processing to improve performance, so that the processor 170 may improve awareness of the voice more than the capability provided by the training corpus.

As the processing power of the voice output apparatus 10 is improved, the speech output may be performed by reflecting the emotion attribute of the input text. Alternatively, even if the input text is not included in the emotion attribute, the voice output apparatus 10 may output the voice by reflecting the intention (emotional information) of the user who created the input text.

Indeed, when a model is built that will be integrated into a TTS module that performs TTS processing, the TTS system may integrate the various components mentioned above with other components. For example, the voice output apparatus 10 may include a block for setting a speaker.

The speaker setting unit may set the speaker for each character appearing in the script. The speaker setup unit may be integrated into the processor 170 or may be integrated as part of the preprocessor or speech synthesis engine. The speaker setting unit synthesizes text corresponding to a plurality of characters into a set speaker's voice using metadata corresponding to a speaker profile.

According to an embodiment of the present invention, a markup language may be used as the meta data, and preferably, speech synthesis markup language (SSML) may be used.

The power supply unit 190 receives power from an external power source or an internal power source under the control of the processor 170 to supply power to each component included in the electronic device 10. The power supply unit 190 includes a battery, and the battery may be provided in a built-in or replaceable form.

Hereinafter, a speech processing procedure performed by a device environment and/or a cloud environment or server environment will be described with reference to FIGS. 7 and 8. FIG. 7 shows an example in which, while a speech can be received in a device 50, a procedure of processing the received speech and thereby synthesize the speech, that is, overall operations of speech synthesis, is performed in a cloud environment 60. On the contrary, FIG. 8 shows an example of on-device processing indicating that a device 70 performs the aforementioned overall operations of speech synthesis by processing a received speech and thereby synthesizing the speech.

In FIGS. 7 and 8, the device environments 70 may be referred to as client devices, and the cloud environments 60 and 80 may be referred to as servers.

FIG. 7 shows a schematic block diagram of a text-to-speech (TTS) device in a TTS system according to an embodiment of the present invention.

In order to process a speech event in an end-to-end speech UI environment, various configurations are required. A sequence for processing the speech event performs signal acquisition playback, speech pre-processing, voice activation, voice output, natural language processing, and speech synthesis by which a device responds to a user.

The client device 50 may include an input module. The input module may receive a user input from a user. For example, the input module may receive the user input from an external device (e.g., a keyboard and a headset) connected thereto. In addition, for example, the input module may include a touch screen. In addition, for example, the input module may include a hardware key located in a user terminal.

According to an embodiment, the input module may include at least one microphone capable of receiving a user's utterance as a speech signal. The input module may include a speech input system and receive a user's speech as a speech signal through the speech input system. By generating an input signal for an audio input, the at least one microphone may determine a digital input signal for a user's speech. According to an embodiment, multiple microphones may be implemented as an array. The array may be arranged in a geometric pattern, for example, a linear geometric shape, a circular geometric shape, or a different random shape. For example, the array may be in a pattern in which four sensors are placed at 90 degrees to receive sound from four directions. In some embodiments, the microphone may include sensors of different arrays in a space of data communication, and may include a networked array of the sensors. The microphone may include an omnidirectional microphone and a directional microphone (e.g., a shotgun microphone).

The client device 50 may include a pre-processing module 51 capable of pre-processing a user input (speech signal) that is received through the input module (e.g., a microphone).

The pre-processing module 51 may include an adaptive echo canceller (AEC) function to thereby remove echo included in a user speech signal received through the microphone. The pre-processing module 51 may include a noise suppression (NS) function to thereby remove background noise included in a user input. The pre-processing module 51 may include an end-point detect (EPD) function to thereby detect an end point of a user speech and thus find out where the user speech exists. In addition, the pre-processing module 51 may include an automatic gain control (AGC) function to thereby control volume of the user speech in such a way suitable for recognizing and processing the user speech.

The client device 50 may include a voice activation module 52. The voice activation module 52 may recognize a wake-up call indicative of recognition of a user's call. The voice activation module 52 may detect a predetermined keyword (e.g., Hi LG) from a user input which has been pre-processed. The voice activation module 52 may remain in a standby state to perform an always-on keyword detection function.

The client device 50 may transmit a user voice input to a cloud server. ASR and natural language understanding (NLU) operations, which are essential to process a user speech, is generally performed in Cloud due to computing, storage, power limitations, and the like. The Cloud may include the cloud device 60 that processes a user input transmitted from a client. The cloud device 60 may exists as a server.

The cloud device 60 may include an auto voice output (ASR) module 61, an artificial intelligent agent 62, a natural language understanding (NLU) module 63, a text-to-speech (TTS) module 64, and a service manager 65.

The ASR module 61 may convert a user input, received from the client device 50, into textual data.

The ASR module 61 includes a front-end speech pre-processor. The front-end speech pre-processor extracts a representative feature from a speech input. For example, the front-perform a Fourier transform on the speech input to extract spectral features that characterize the speech input as a sequence of representative multi-dimensional vectors. In addition, The ASR module 61 may include one or more voice output modules (e.g., an acoustic model and/or a language module) and may realize one or more voice output engines. Examples of the voice output model include Hidden Markov Models, Gaussian-Mixture Models, Deep Neural Network Models, n-gram language models, and other statistical models. Examples of the voice output model include a dynamic time warping (DTW)-based engine and a weighted finite state transducer (WFST)-based engine. The one or more voice output models and the one or more voice output engines can be used to process the extracted representative features of the front-end speech pre-processor to produce intermediate recognitions results (e.g., phonemes, phonemic strings, and sub-words), and ultimately, text recognition results (e.g., words, word strings, or sequence of tokens).

Once the ASR module 61 generates a recognition result including a text string (e.g., words, or sequence of words, or sequence of tokens), the recognition result is transmitted to the NLP module 732 for intention deduction. In some examples, The ASR module 730 generates multiple candidate text expressions for a speech input. Each candidate text expression is a sequence of works or tokens corresponding to the speech input.

The NLU module 63 may perform a syntactic analysis or a semantic analysis to determine intent of a user. The syntactic analysis may be used to divide a user input into syntactic units (e.g., words, phrases, morphemes, or the like) and determine whether each divided unit has any syntactic element. The semantic analysis may be performed using semantic matching, rule matching, formula matching, or the like. Thus, the NLU module 63 may obtain a domain, intent, or a parameter (or a slot) necessary to express the intent from a user input through the above-mentioned analysis.

According to an embodiment, the NLU module 63 may determine the intent of the user and a parameter using a matching rule which is divided into a domain, intent, and a parameter. For example, one domain (e.g., an alarm) may include a plurality of intents (e.g., alarm setting, alarm release, and the like), and one intent may need a plurality of parameters (e.g., a time, the number of iterations, an alarm sound, and the like). The plurality of rules may include, for example, one or more mandatory parameters. The matching rule may be stored in a natural language understanding database.

According to an embodiment, the NLU module 63 may determine a meaning of a word extracted from a user input using a linguistic feature (e.g., a syntactic element) such as a morpheme or a phrase and may match the determined meaning of the word to the domain and intent to determine the intent of the user. For example, the NLU module 63 may determine the intent of the user by calculating how many words extracted from a user input are included in each of the domain and the intent. According to an embodiment, the NLU module 63 may determine a parameter of the user input using a word which is the basis for determining the intent. According to an embodiment, the NLU module 63 may determine the intent of the user using a NLU DB which stores the linguistic feature for determining the intent of the user input. According to another embodiment, the NLU module 63 may determine the intent of the user using a personal language model (PLM). For example, the NLU module 63 may determine the intent of the user using personalized information (e.g., a contact list, a music list, schedule information, social network information, etc.). For example, the PLM may be stored in, for example, the NLU DB. According to an embodiment, the ASR module 61 as well as the NLU module 63 may recognize a voice of the user with reference to the PLM stored in the NLU DB.

According to an embodiment, the NLU module 63 may further include a natural language generating module (not shown). The natural language generating module may change specified information to a text form. The information changed to the text form may be a natural language speech. For example, the specified information may be information about an additional input, information for guiding the completion of an action corresponding to the user input, or information for guiding the additional input of the user. The information changed to the text form may be displayed in a display after being transmitted to the client device or may be changed to a voice form after being transmitted to the TTS module.

The TTS module 64 may convert text input to voice output. The TTS module 64 may receive text input from the NLU module 63 of the LNU module 63, may change the text input to information in a voice form, and may transmit the information in the voice form to the client device 50. The client device 50 may output the information in the voice form via the speaker.

The speech synthesis module 64 synthesizes speech outputs based on a provided text. For example, a result generated by the ASR module 61 may be in the form of a text string. The speech synthesis module 64 may convert the text string to an audible speech output. The speech synthesis module 64 may use any appropriate speech synthesis technique in order to generate speech outputs from text, including, but not limited, to concatenative synthesis, unit selection synthesis, diphone synthesis, domain-specific synthesis, formant synthesis, articulatory synthesis, hidden Markov model (HMM) based synthesis, and sinewave synthesis.

In some examples, the speech synthesis module 64 may be configured to synthesize individual words based on phonemic strings corresponding to the words. For example, a phonemic string can be associated with a word in a generated text string. The phonemic string can be stored in metadata associated with the word. The speech synthesis model 64 may be configured to directly process the phonemic string in the metadata to synthesize the word in speech form.

Since the cloud environment generally has more processing capabilities or resources than the client device, a higher quality speech output may be obtained in synthesis on the client side. However, the present invention is not limited thereto, and the speech synthesis process may be performed on the client side (see FIG. 8).

Meanwhile, according to an embodiment, the client environment may further include an Artificial Intelligence (AI) agent 62. The AI processor 62 is defined to perform at least some of the above-described functions performed by the ASR module 61, the NLU module 62 and/or the TTS module 64. In addition, the AI module 62 may make contribution so that the ASR module 61, the NLU module 62 and/or the TTS module 64 perform independent functions, respectively.

The AI processor module 62 may perform the above-described functions through deep learning. The deep learning represents a certain data in a form readable by a computer (e.g., when the data is an image, pixel information is represented as column vectors or the like), and efforts are being made to conduct enormous researches for applying the representation to learning (which is about how to create better representation techniques and how to create a model that learns the better representation techniques), and, as a result, various deep learning techniques such as deep neural networks (DNN), convolutional deep neural networks (CNN), Recurrent Boltzmann Machine (RNN), Restricted Boltzmann Machine (RBM), deep belief networks (DBN), and Deep Q-Network, may be applied to computer vision, voice output, natural language processing, speech/signal processing, and the like.

Currently, all commercial voice output systems (Microsoft's Cortana, Skype translator, Google Now, Apple Siri, etc.). are based on deep learning techniques.

In particular, the AI processor module 62 may perform various natural language processes, including machine translation, emotion analysis, and information retrieval, to process natural language by use of a deep artificial neural network architecture.

Meanwhile, the cloud environment may include a service manager 65 capable of collecting various personalized information and supporting a function of the AI processor 62. The personalized information obtained through the service manager may include at least one data (a calendar application, a messaging service, usage of a music application, etc.) used through the cloud environment, at least one sensing data (a camera, a microphone, temperature, humidity, a gyro sensor, C-V2X, a pulse, ambient light, Iris scan, etc.) collected by the client device 50 and/or the cloud 60, off device data directly not related to the client device 50. For example, the personalized information may include maps, SMS, news, music, stock, weather, Wikipedia information.

For convenience of explanation, the AI processor 62 is represented as an additional block to be distinguishable from the ASR module 61, the NLU module 63, and the TTS module 64, but the AI processor 62 may perform at least some or all of the functions of the respective modules 61, 62, and 64.

In FIG. 7, an example in which the AI processor 62 is implemented in the cloud environment due to computing calculation, storage, power limitations, and the like, but the present invention is not limited thereto.

For example, FIG. 8 is identical to what is shown in FIG. 7, except for a case where the AI processor is included in the cloud device.

FIG. 8 is a schematic block diagram of a TTS device in a TTS system environment according to an embodiment of the present invention. A client device 70 and a cloud environment 80 shown in FIG. 8 may correspond to the client device 50 and the cloud device 60 aforementioned in FIG. 7, except for some configurations and functions. Accordingly, description about specific functions of corresponding blocks may refer to FIG. 7.

Referring to FIG. 8, the client device 70 may include a pre-processing module 51, a voice activation module 72, an ASR module 73, an AI processor 74, an NLU module 75, and a TTS module 76. In addition, the client device 50 may include an input module (at least one microphone) and at least one output module.

In addition, the cloud environment may include cloud knowledge 80 that stores personalized information in a knowledge form.

A function of each module shown in FIG. 8 may refer to FIG. 7. However, since the ASR module 73, the NLU module 75, and the TTS module 76 are included in the client device 70, communication with Cloud may not be necessary for a speech processing procedure such as voice output, speech synthesis, and the like, and thus, an instant real-time speech processing operation is possible.

Each module shown in FIGS. 7 and 8 are merely an example for explaining a speech processing procedure, and modules more or less than in FIGS. 7 and 8 may be included. In addition, two or more modules may be combined or different modules or modules with different arrangement structures may be included. The various modules shown in FIGS. 7 and 8 may be implemented in hardware, software instructions for execution by one or more processors, firmware, including one or more signal processing and/or application specific integrated circuits, or a combination thereof.

FIG. 9 is a schematic block diagram of an AI processor capable of performing emotion classification information-based TTS according to an embodiment of the present invention.

Referring to FIG. 9, in the speech processing procedure described with reference to FIGS. 7 and 8, the AI processor 74 may support an interactive operation with a user, in addition to an ASR operation, an NLU operation, and a TTS operation. Alternatively, using context information, the AI processor 74 may make contribution so that the NLU module 63 further clarify, complements, or additionally define information included in text expressions received from the ASR module 61.

Here, the context information may include preference of a user of a client device, hardware and/or software states of the client device, various types of sensor information received before, during, or after a user input, previous interactions (e.g., dialogue) between the AI processor and the user, etc. In the present disclosure, the context information is dynamic and varies depending on time, location, contents of the dialogue, and other elements.

The AI processor 74 may further include a context fusion and learning module 91, a local knowledge 92, and a dialogue management 93.

The context fusion and learning module 91 may learn a user's intent based on at least one data. The at least one data may further include at least one sensing data obtained by a client device or a cloud environment. In addition, the at least one data may further include speaker identification, acoustic event detection, a speaker's personal information (gender and age detection), voice activity detection (VAD), and emotion classification information.

The speaker identification may indicate specifying a speaker in a speaker group registered by a speech. The speaker identification may include identifying a pre-registered speaker or registering a new speaker. The acoustic event detection may outdo a voice output technique and may be used to recognize acoustics itself to recognize a type of sound and a place where the sound occurs. The VAD is a speech processing technique of detecting presence or absence of a human speech (voice) from an audio signal that can include music, noise, or any other sound. According to an embodiment, the AI processor 74 may detect presence of a speech from the input audio signal. According to an embodiment the AI processor 74 differentiates a speech data and a non-speech data using a deep neural networks (DNN) model. In addition, the AI processor 74 may perform emotion classification information on the speech data using the DNN model. According to the emotion classification information, the speech data may be classified as anger, boredom, fear, happiness, or sadness.

The contest fusion and learning module 91 may include a DNN model to perform the above-described operation, and may determine intent of a user input based on sensing information collected in the DNN model, the client device or the cloud environment.

The at least one data is merely an example and may include any data that can be referred to so as to determine intent of a user in a speech processing procedure. The at least one data may be obtained through the above-described DNN model.

The AI processor 74 may include the local knowledge 92. The local knowledge 92 may include user data. The user data may include a user's preference, the user's address, the user's initially set language, the user's contact list, etc. According to an embodiment, the AI processor 74 may additionally define the user's intent by complementing information included in the user's speech input using the user's specific information. For example, in response to the user's request "Invite my friends to my birthday party", the AI processor 74 does not request more clarified information from the user and may utilize the local knowledge 92 to determine who "the friends" are and when and where the "birthday" takes place.

The AI processor 74 may further include the dialogue management 93. The AI processor 74 may provide a dialogue interface to enable speech conversation with the user. The dialogue interface may refer to a procedure of outputting a response to the user's speech input through a display or a speaker. Here, a final result output through the dialogue interface may be based on the ASR operation, the NLU operation, and the TTS operation, which are described above.

I. VOICE OUTPUT METHOD

FIG. 10 shows a voice output system according to an embodiment of the present invention.

As shown in FIG. 10, the voice output system according to an embodiment of the present invention may include a plurality of voice output devices 11, 12, 13, 14, 15, and 10.

Specifically, the plurality of voice output devices 10, 11, 12, 13, 14, and 15 may recognize a voice spoken by a user 1001. For example, the plurality of voice output devices may be voice output devices described with reference to FIGS. 4 to 9. In this case, each of the voice output devices 11, 12, 13, 14, and 15 may be an IoT device. In this case, the voice output device 10 may be a server 10.

Each of the IoT devices 11, 12, 13, 14, and 15 may detect, through a microphone, a signal including a user's voice. When a voice is detected through the microphone, each of the IoT devices 11, 12, 13, 14, and 15 may transmit a microphone detection signal to the server 10.

The server 10 may recognize the voice in the microphone detection signal transmitted by the IoT device. After the voice is recognized, the server 10 may select a response device for outputting a response related to the voice among the IoT devices. The server 10 may determine response intensity of an IoT device, selected as a response device among the IoT devices, based on a result of the recognition of the voice by the IoT device selected as the response device. After the response intensity is determined, the server 10 may transmit, to the IoT device selected as the response device, a response command that enables a response to be output with the determined response intensity.

FIG. 11 shows a voice output system according to another embodiment of the present invention.

As shown in FIG. 11, according to another embodiment of the present invention, the voice output system may include a plurality of sub-IoT devices 11, 12, 14, and 15 and a main IoT device 10.

In this case, the plurality of sub-IoT devices 11, 12, 14, and 15 and the main IoT device 10 may be voice output devices described with reference to FIGS. 4 to 9. That is, each of the plurality of sub-IoT devices 11, 12, 14, and 15 and the main IoT device 10 may recognize a user's voice 1001, and may output a response related to the user's voice 1001.

In this case, the main IoT device 10 may perform the function of the server 10 described with reference to FIG. 10. The plurality of sub-IoT devices 11, 12, 14, and 15 may perform the functions of the plurality of IoT devices described with reference to FIG. 10.

In this case, each of the sub-IoT devices 11, 12, 14, and 15 may also perform the function of the main IoT device 10.

The plurality of IoT devices, the server, the plurality of sub-IoT devices and the main IoT device have been illustrated as being voice output devices with reference to FIGS. 10 and 11. Hereinafter, an example in which each of the plurality of IoT devices 11, 12, 13, 14, and 15 performs a function for detecting a voice and transmitting a microphone detection signal to the server 10 and the server 10 performs a function for obtaining a microphone detection signal from a plurality of IoT devices and determining a response device is described. The present invention is not essentially limited to the example. As described with reference to FIG. 11, it is evident to those skilled in the art that one main IoT device of a plurality of IoT devices may perform the function of the server 10 to be described below on behalf of the server.

Each of the IoT devices 11, 12, 13, 14, and 15 that detects a voice and transmits a microphone detection signal to the server 10 is defined as a voice output device.

FIG. 12 is a flowchart showing voice output method according to an embodiment of the present invention.

As shown in FIG. 12, the voice output device (e.g., the server 10 of FIG. 10) according to an embodiment of the present invention may obtain the first voice of a user (S110).

Specifically, each of a plurality of voice output devices (e.g., the IoT devices 11, 12, 13, 14, and 15 of FIG. 10 or the sub-IoT devices 11, 12, 14, and 15 of FIG. 11) may detect a first voice in the speaking of a user, and a server may obtain the first voice from the plurality of voice output devices.

Next, the server may select a device that will respond to the first voice, among a plurality of voice output devices (S130).

For example, the server may perform a preprocessing process on the first voice, and may select a response device that will respond to the first voice using a natural language understanding module (e.g., the natural language understanding module 63, 75 of FIG. 7, FIG. 8) based on the pre-processed first voice. For example, the server may select a device that will respond to the first voice, among the plurality of voice output devices.

Next, the server may control the response device based on recognition state information of the response device for the first voice so that the response device outputs a response (S150).

For example, the server may first determine recognition state information of the response device for the first voice. For example, the server may determine the intensity of a response based on whether the response device has succeeded in voice output for the first voice, and may transmit a response command to the response device so that it outputs the response with the determined intensity.

The recognition state information may include information related to whether the response device has successfully recognized the first voice. Furthermore, the recognition state information may include information related to whether the recognition ratio of the response device for the first voice exceeds a preset threshold. Furthermore, the recognition state information may include received intensity of the microphone detection signal of the response device, including the first voice. Furthermore, the recognition state information may include signal to noise ratio (SNR) information of the microphone detection signal of the response device, including the first voice.

Although not described above, step S100 of FIG. 12 may be performed by the processor (e.g., the processor 170 of FIG. 6) of a server.

FIG. 13 is a detailed flowchart showing the voice output step (step S150 of FIG. 12) according to an embodiment of the present invention.

As shown in FIG. 13, the server may determine a spoken distance based on a result of the recognition of the first voice by the response device (S151).

In this case, the spoken distance may mean the distance between the response device and the point at which the first voice was spoken.

The server may determine response intensity based on the spoken distance (S152).

Specifically, the server may determine the intensity that the response device outputs a response related to the first voice based on the spoken distance between the response device and the point at which the first voice was spoken.

Next, the server may obtain surrounding noise information based on a result of the recognition of the voice by the response device (S153).

In this case, the surrounding noise information may include information related to noise around the response device.

Finally, the server may adjust the response intensity based on the surrounding noise information (S154).

For example, after the server determines the response intensity based on the spoken distance at step S152, it may adjust the response intensity again based on noise information around the response device.

Although not described above, step S150 of FIG. 13 may be performed by the processor (e.g., the processor 170 of FIG. 6) of the server.

FIG. 14 is a detailed flowchart showing the spoken distance determination step (step S151 of FIG. 13) according to an embodiment of the present invention.

As shown in FIG. 14, the server may determine whether the response device has succeeded in voice output for the first voice (S1510).

If, as a result of the determination, the response device has succeeded in the recognition of the first voice, the server may obtain, from the response device, the first microphone detection signal of the first voice recognized by the response device (S1511).

For example, the response device succeeds in the recognition of the first voice, the server may request, from the response device, a first microphone detection signal including the first voice among the microphone detection signals detected by the response device, and may obtain the first microphone detection signal from the response device as a response to the request.

Next, the server may determine received intensity of the first microphone detection signal (S1513).

For example, the server may determine received intensity of the first microphone detection signal based on the amplitude of the first microphone detection signal.

The server may determine a spoken distance, that is, the distance between the response device and the spoken point, based on the received intensity of the first microphone detection signal (S1515).

It has been assumed that step S151 of FIG. 14 is performed by the server. However, it is evident to those skilled in the art that step S151 may be performed by the processor e.g., the processor 170 of FIG. 6) of the server.

FIG. 15 shows an example of the spoken distance determination and response intensity determination of FIG. 14.

As shown in FIG. 15, the server 10 may obtain a microphone detection signal from which, for example, "Hi, LG Air-conditioner. Set temperature to 18 degrees" was detected from the response device 11 that has recognized, for example, "Hi, LG Air-conditioner. Set temperature to 18 degrees", that is, a voice spoken by the user 1001.

The server 10 may determine that received intensity of the microphone detection signal is −12 decibel (dB) by analyzing the microphone detection signal.

In this case, the server 10 may determine that the distance between the response device 11 and the spoken point of the voice is 1 meter based on that the received intensity of the microphone detection signal is −12 dB.

After the server 10 determines that the distance between the response device 11 and the spoken point of the voice is 1 meter, it may determine output intensity of a response from the response device 11 to be 8 (e.g., volume: 8) based on that the distance between the response device 11 and the spoken point of the voice is 1 meter.

Next, the server 10 may transmit, to the response device 11, a response command that enables the response device to output a response (e.g., "Yes, air-conditioner was set to 18 degrees") related to the voice (e.g., "Hi, LG Air-conditioner. Set temperature to 18 degrees") with the determined output intensity (e.g., volume: 8).

When the response device 11 receives the response command that enables the response device to output the response (e.g., "Yes, air-conditioner was set to 18 degrees") related to the voice (e.g., "Hi, LG Air-conditioner. Set temperature to 18 degrees") with the determined output intensity (e.g., volume: 8), the response device may output the response (e.g., "Yes, air-conditioner was set to 18 degrees") related to the voice (e.g., "Hi, LG Air-conditioner. Set temperature to 18 degrees") with the determined output intensity (e.g., volume: 8).

FIG. 16 shows another example of the spoken distance determination and response intensity determination of FIG. 14.

As shown in FIG. 16, the server 10 may obtain a microphone detection signal from which, for example, "Hi, LG Air-conditioner. Set temperature to 18 degrees" was detected from the response device 11 that has recognized, for example, "Hi, LG Air-conditioner. Set temperature to 18 degrees", that is, a voice spoken by the user 1001.

The server 10 may determine that received intensity of the microphone detection signal is −18 dB by analyzing the microphone detection signal.

In this case, the server 10 may determine that the distance between the response device 11 and the spoken point of the voice is 5 meters based on that the received intensity of the microphone detection signal is −18 dB.

After the server 10 determines that the distance between the response device 11 and the spoken point of the voice is 5 meters, it may determine output intensity of a response from the response device 11 to be 18 (e.g., volume: 18) based on that the distance between the response device 11 and the spoken point of the voice is 5 meters.

Next, the server 10 may transmit, to the response device 11, a response command that enables the response device 11 to output a response (e.g., "Yes, air-conditioner was set to 18 degrees") related to the voice (e.g., "Hi, LG Air-conditioner. Set temperature to 18 degrees") with the determined output intensity (e.g., volume: 18).

When the response device 11 receives the response command that enables the response device to output the response (e.g., "Yes, air-conditioner was set to 18 degrees") related to the voice (e.g., "Hi, LG Air-conditioner. Set temperature to 18 degrees") with the determined output intensity (e.g., volume: 18), it may output the response (e.g., "Yes, air-conditioner was set to 18 degrees") related to the voice (e.g., "Hi, LG Air-conditioner. Set temperature to 18 degrees") with the determined output intensity (e.g., volume: 18).

FIG. 17 is a detailed flowchart showing the step of determining a spoken distance when a response device fails in the recognition of a first voice.

As shown in FIG. 17, if it is determined that the response device has failed in the recognition of the first voice in step S1510 of FIG. 14, the server may obtain, from a plurality of other first devices, a plurality of second microphone detection signals of the first voice recognized by the plurality of first devices around the response device (S1512).

For example, if it is determined that the response device has failed in the recognition of the first voice, the server may identify a plurality of first devices successful in the recognition of the first voice, may request a plurality of second microphone detection signals of the first voice, recognized by the plurality of identified first devices, from the plurality of identified first devices, and may obtain the plurality of second microphone detection signals from the plurality of first devices as a response to the request.

Next, the server may determine received intensity of the second microphone detection signal (S1514).

Thereafter, the server may determine the point at which the first voice was spoken based on the received intensity of the second microphone detection signal (S1516).

For example, the server may calculate the distance from each of the plurality of first devices to the point at which the first voice was spoken based on the received intensity of each of the plurality of second microphone detection signals, and may determine the location of the spoken point based on the distance from each of the plurality of first devices to the point at which the first voice was spoken.

Finally, the server may determine the spoken distance between the response device and the spoken point based on the determined spoken point (S1518).

It is evident that step S151 may be performed by the processor of the server.

FIG. 18 shows an example of the spoken distance determination of FIG. 17.

As shown in FIG. 18, when a first voice (e.g., "Hi, LG Roboking. Clean in one hour") is spoken from a user 1001, at least one of a plurality of voice output devices 11, 12, 13 and 14 may recognize the first voice through a microphone. In this case, a Roboking 15 may fail in the recognition of the first voice.

At least one of the plurality of voice output devices 11, 12, 13 and 14 that has recognized the first voice may transmit the first voice to the server 10.

When the first voice is obtained, the server 10 may determine a response device for responding to the first voice to be the Roboking 15 based on the first voice, and may determine a response (e.g., "Yes, will clean in one hour") of the response device.

Next, the server 10 may identify that the Roboking 15, that is, the response device, has failed in the voice output.

Thereafter, the server 10 may request a plurality of second microphone detection signals from which the first voice was detected from the plurality of first devices 11, 12, 13 and 14, that is, other surrounding devices except the Roboking 15, and may obtain the plurality of second microphone detection signals from which the first voice was detected from the plurality of first devices 11, 12, 13 and 14 as a response to the request.

Next, the server 10 may determine the distance from each of the first devices 11, 12, 13 and 14 to the spoken point by analyzing received intensity of each of the plurality of second microphone detection signals. Next, the server 10 may determine the point at which the first voice was spoken based on the distance from each of the first devices 11, 12, 13 and 14 to the spoken point.

Next, the server 10 may determine the spoken distance between the point at which the first voice was spoken and the Roboking 15, that is, a response device, to be 3 meters.

Next, the server 10 may determine the intensity (e.g., volume: 15) of a response to be output by the Roboking 15 based on the spoken distance (3 meters) between the Roboking 15 and the spoken point.

The server 10 may transmit, to the Roboking 15 that is the response device, a response command that enables the Roboking to output a response (e.g., "Yes, will clean in one hour") related to the first voice with the determined intensity (e.g., volume: 15). The Roboking 15, that is, the response device, may output the response (e.g., "Yes, will clean in one hour") related to the first voice with the determined intensity (e.g., volume: 15).

FIG. 19 is a detailed flowchart showing the step of determining surrounding noise information (step S153 of FIG. 13) according to an embodiment of the present invention.

As shown in FIG. 19, the server may determine whether the response device has succeeded in voice output for the first voice (S1530).

If, as a result of the determination, the response device has succeeded in the recognition of the first voice, the server may obtain a first microphone detection signal of the first voice recognized by the response device (S1531).

A method of obtaining, by the response device, the first microphone detection signal from which the first voice has been detected is the same as that described with reference to step S1511 of FIG. 14, and thus a description thereof is omitted hereinafter.

Next, the server may determine the SNR of the first microphone detection signal (S1533).

Finally, the server may determine noise information around the response device based on the SNR of the first microphone detection signal (S1535).

FIG. 20 shows an example of the surrounding noise information determination and response intensity determination of FIG. 19.

As shown in FIG. 20, the server 10 may obtain a microphone detection signal from which, for example, "Hi, LG Air-conditioner. Set temperature to 18 degrees" was detected from the response device 12 that has recognized, for example, "Hi, LG Air-conditioner. Set temperature to 18 degrees", that is, a voice spoken by the user 1001.

The server 10 may determine the SNR of the microphone detection signal to be 0.2 by analyzing the microphone detection signal.

Next, the server 10 may determine that there is noise information (e.g., speaker operation noise or robot operation noise) around the response device 12 based on that the SNR of the microphone detection signal is 0.2.

Next, the server 10 may adjust response intensity (e.g., volume: 8), predetermined based on received intensity (−12 dB), to 18 (e.g., volume: 18) based on the noise information (e.g., speaker operation noise or robot operation noise) around the response device 12.

Next, the server 10 may transmit, to the response device 12, a response command that enables the response device to output a response (e.g., "Yes, air-conditioner was set to 18 degrees") related to the voice (e.g., "Hi, LG Air-conditioner. Set temperature to 18 degrees") with the adjusted output intensity (e.g., volume: 18).

When the response device 12 receives the response command that enables the response device to output the response (e.g., "Yes, air-conditioner was set to 18 degrees") related to the voice (e.g., "Hi, LG Air-conditioner. Set temperature to 18 degrees") with the adjusted output intensity (e.g., volume: 18), the response device 12 may output the response (e.g., "Yes, air-conditioner was set to 18 degrees") related to the voice (e.g., "Hi, LG Air-conditioner. Set temperature to 18 degrees") with the determined output intensity (e.g., volume: 18).

FIG. 21 is a detailed flowchart showing the step of determining surrounding noise information when a response device fails in the recognition of a first voice.

As shown in FIG. 21, if it is determined that the response device has failed in the recognition of the first voice in step S1530 of FIG. 19, the server may obtain, from a plurality of other first devices around the response device, a plurality of second microphone detection signals of the first voice recognized by the plurality of first devices (S1532).

For example, if it is determined that the response device has failed in the recognition of the first voice, the server may identify a plurality of first devices successful in the recognition of the first voice, may request, from the plurality of identified first devices, a plurality of second microphone detection signals from which the first voice has been detected, and may obtain the plurality of second microphone detection signals from the plurality of first devices as a response to the request.

Next, the server may determine the SNR of each of the second microphone detection signals (S1534).

The server may determine noise information around the response device based on the SNR of the second microphone detection signal (S1536).

FIG. 22 shows an example of the surrounding noise information determination and response intensity determination of FIG. 21.

As shown in FIG. 22, when a first voice (e.g., "Hi, LG Air-conditioner. Set temperature to 18 degrees") is spoken by the user 1001, at least one of a plurality of voice output devices 11 and 13 may recognize the first voice through a microphone. In this case, an air-conditioner 12 may fail in the recognition of the first voice.

At least one of the plurality of voice output devices 11 and 13 that has recognized the first voice may transmit the first voice to the server 10.

When the first voice is obtained, the server 10 may determine a response device for responding to the first voice to be the air-conditioner 12 based on the first voice, and may determine a response (e.g., "Yes, air-conditioner was set to 18 degrees") from the response device.

Next, the server 10 may identify that the air-conditioner 12, that is, the response device, has failed the voice output.

Thereafter, the server 10 may request a plurality of second microphone detection signals from which the first voice has been detected from the plurality of first devices 11 and 13, that is, surrounding devices except the air-conditioner 12, and may obtain, from the plurality of first devices 11 and 13, the plurality of second microphone detection signals from which the first voice has been detected as a response to the request.

Next, the server 10 may determine noise information (e.g., surrounding noise) around the air-conditioner 12, that is, the response device, by analyzing the SNR (e.g., 03 or 02) of each of the plurality of second microphone detection signals.

Next, the server 10 may adjust the intensity of the response to be output by the air-conditioner 12 from 18 to 20 based on the surrounding noise information.

The server 10 may transmit, to the air-conditioner 12 that is the response device, a response command that enables the air-conditioner to output a response (e.g., "Yes, air-conditioner was set to 18 degrees") related to the first voice with the adjusted intensity (e.g., volume: 20).

FIG. 23 is a detailed flowchart showing a process of obtaining estimated noise information and incorporating it into response intensity.

As shown in FIG. 23, after step S154 of FIG. 13, the server may obtain operating state information of a plurality of devices (S155).

For example, the operating state information of the plurality of devices may include information related to whether each IoT device operates and the type of operation.

The server may extract a feature value of the operating state information of each of the plurality of devices (S156).

The server may input the feature value of the operating state information to a pre-trained artificial neural network (S157).

In this case, the artificial neural network may mean a deep learning model pre-trained to output estimated noise information using an operating state as an input value.

Next, the server may obtain estimated noise information from the artificial neural network (S158).

The server may incorporate the obtained estimated noise information into response intensity (S159).

For example, the server may adjust response intensity, predetermined based on a spoken distance and surrounding noise information, based on the estimated noise information again.

FIG. 24 is a detailed block diagram of the deep learning model according to an embodiment of the present invention.

As shown in FIG. 24, the memory 25 of the AI device 20 of FIG. 5 may include a deep learning model 2400. The deep learning model 2400 may include a noise model corresponding to a plurality of devices.

Specifically, the deep learning model 2400 may include a terminal noise model 2401 trained to output noise information around a terminal using the operating state of the terminal as an input value. Furthermore, the deep learning model 2400 may include a PC noise model 2402 trained to output noise information around a PC using the operating state of the PC as an input value. The deep learning model 2400 may include a speaker noise model 2403 trained to output noise information around a speaker using the operating state of the speaker as an input value. The deep learning model 2400 may include a Roboking noise model 2404 trained to output noise information around a Roboking using the operating state of the Roboking as an input value. The deep learning model 2400 may include an air-conditioner noise model 2405 trained to output noise information around an air-conditioner using the operating state of the air-conditioner as an input value.

FIG. 25 shows recognition state information and operating state information according to an embodiment of the present invention.

As shown in FIG. 25, the server may analyze recognition state information and operating state information of each of voice output devices (e.g., an air-conditioner, Roboking, TV, a mobile phone, a refrigerator, a washing machine, and a speaker), and may determine the intensity of a response based on the recognition state information and the operating state information.

Specifically, the server may determine response intensity based on recognition state information (e.g., SNR or amplitude) of each voice output device and operating state information (activation, Act) of each voice output device.

J. EMBODIMENT SUMMARY

Embodiment 1

An intelligent voice output method includes the steps of obtaining a voice, selecting a response device for a response to the voice among a plurality of voice output devices, and outputting a response related to the voice through the response device based on recognition state information of the voice recognized by the response device.

Embodiment 2

In Embodiment 1, the step of outputting a response may include the steps of determining a spoken distance between the response device and a point at which the voice is spoken based on a result of the recognition of the voice by the response device and outputting the response based on the spoken distance.

Embodiment 3

In Embodiment 2, the step of determining a spoken distance may include the steps of determining the spoken distance based on received intensity of a first microphone detection signal of the voice recognized by the response device if the response device succeeds in the recognition of the voice, determining the point at which the voice is spoken based on received intensity of a second microphone detection signal of the voice recognized by a first device successful in the recognition of the voice if the response device fails in the recognition of the voice, and determining the spoken distance based on the point at which the voice is spoken.

Embodiment 4

In Embodiment 3, the step of outputting a response may further include the steps of obtaining noise information around the response device based on the result of the recognition of the voice by the response device and outputting the response based on the surrounding noise information.

Embodiment 5

In Embodiment 4, the step of obtaining noise information may include the steps of obtaining noise information around the response device based on the signal to noise ratio (SNR) of the first microphone detection signal of the voice recognized by the response device if the response device succeeds in the recognition of the voice, and determining noise information around the response device based on the SNR of the second microphone detection signal of the voice recognized by the first device successful in the recognition of the voice if the response device fails in the recognition of the voice.

Embodiment 6

In Embodiment 5, the step of obtaining noise information may include the steps of inputting the operating state of at least one of the plurality of voice output devices to a pre-trained noise model and obtaining estimated noise information determined based on the operating state. The step of outputting a response may further include the step of outputting the response based on the surrounding noise information and the estimated noise information.

Embodiment 7

In Embodiment 6, the step of inputting the operating state to the pre-trained noise model may include the steps of accessing a 5G wireless communication system providing a 5th generation (5G) service, connecting to the plurality of voice output devices through the 5G wireless communication system, and receiving the operating state of each of the plurality of voice output devices from the plurality of voice output devices through the 5G service provided by the 5G wireless communication system.

Embodiment 8

In Embodiment 7, the 5G service may include a massive machine-type communication (mMTC) service. The step of receiving the operating state of each of the plurality of voice output devices may include receiving the operating state of each of the plurality of voice output devices from the plurality of voice output devices through an MTC physical uplink shared channel (MPUSCH) and/or an MTC physical uplink control channel (MPUCCH) which is a physical resource provided through the mMTC service.

Embodiment 9

In Embodiment 8, the 5G wireless communication system includes a narrowband-Internet of things (NB-IoT) system providing a system bandwidth related to some resource blocks of the 5G wireless communication system and providing the mMTC service. The step of receiving the operating state of each of the plurality of voice output devices may include the steps of performing an initial access procedure on the 5G wireless communication system through an anchor type carrier related to the NB-IoT system and receiving the operating state of each of the plurality of voice output devices from the plurality of voice output devices through a non-anchor type carrier related to the NB-IoT system.

Embodiment 10

In Embodiment 4, the step of obtaining noise information may include the step of determining the point at which the voice is spoken based on the received intensity of the second microphone detection signal of the voice recognized by the first device successful in the recognition of the voice. the step of outputting a response may include outputting the response based on first surrounding noise information around the response device and second surrounding noise information around the point at which the voice is spoken.

Embodiment 11: an intelligent voice output device includes a communication unit obtaining a voice from a plurality of voice output devices, and a processor configured to select a response device for a response to the voice among the plurality of voice output devices and to control the response device to output a response related to the voice based on recognition state information of the voice recognized by the response device through the communication unit.

Embodiment 12

In Embodiment 11, the processor may be configured to determine a spoken distance between the response device and a point at which the voice is spoken based on a result of the recognition of the voice by the response device and to control the response device to output the response based on the spoken distance through the communication unit.

Embodiment 13

In Embodiment 12, the processor may be configured to determine the spoken distance based on received intensity of a first microphone detection signal of the voice recognized by the response device if the response device succeeds in the recognition of the voice, determine the point at which the voice is spoken based on received intensity of a second microphone detection signal of the voice recognized by a first device successful in the recognition of the voice if the response device fails in the recognition of the voice, and determine the spoken distance based on the point at which the voice is spoken.

Embodiment 14

In Embodiment 13, the processor may be configured to control the response device to obtain noise information around the response device based on the result of the recognition of the voice by the response device and to output the response based on the surrounding noise information.

Embodiment 15

In Embodiment 14, the processor may be configured to obtain noise information around the response device based on the signal to noise ratio (SNR) of the first microphone detection signal of the voice recognized by the response device if the response device succeeds in the recognition of the voice and to determine noise information around the response device based on the SNR of the second microphone detection signal of the voice recognized by the first device successful in the recognition of the voice if the response device fails in the recognition of the voice.

Embodiment 16

In Embodiment 15, the processor may be configured to input the operating state of at least one of the plurality of voice output devices to a pre-trained noise model and to control the response device to obtain estimated noise information determined based on the operating state and output the response based on the surrounding noise information and the estimated noise information.

Embodiment 17

In Embodiment 16, the processor may be configured to control the communication unit to access a 5G wireless communication system providing a 5th generation (5G) service, to connect to the plurality of voice output devices through the 5G wireless communication system, and to receive the operating state of each of the plurality of voice output devices from the plurality of voice output devices through the 5G service provided by the 5G wireless communication system.

Embodiment 18

In Embodiment 17, the 5G service includes a massive machine-type communication (mMTC) service. The processor may be configured to control the communication unit to receive the operating state of each of the plurality of voice output devices from the plurality of voice output devices through an MTC physical uplink shared channel (MPUSCH) and/or an MTC physical uplink control channel (MPUCCH) which is a physical resource provided through the mMTC service.

Embodiment 19

In Embodiment 18, the 5G wireless communication system may include a narrowband-Internet of things (NB-IoT) system providing a system bandwidth related to some resource blocks of the 5G wireless communication system and providing the mMTC service. The processor may be configured to control the communication unit to perform an initial access procedure on the 5G wireless communication system through an anchor type carrier related to the NB-IoT system and to receive the operating state of each of the plurality of voice output devices from the plurality of voice output devices through a non-anchor type carrier related to the NB-IoT system.

Embodiment 20

In Embodiment 14, the processor may be configured to control the response device to determine the point at which the voice is spoken based on the received intensity of the second microphone detection signal of the voice recognized by the first device successful in the recognition of the voice, and to output the response based on first surrounding noise information around the response device and second surrounding noise information around the point at which the voice is spoken.

Embodiment 21

A non-transitory computer-readable recording medium is a non-transitory computer-readable recording medium in which a computer-executable component configured to be executed in at least one processor of a computing device is stored. The computer-executable component obtains a voice from a plurality of voice output devices, selects a response device for a response to the voice among the plurality of voice output devices, and controls the response device to output a response related to the voice based on recognition state information of the voice recognized by the response device through a communication unit.

The present invention may be implemented as a computer-readable code in a medium in which a program is written. The computer-readable medium includes all types of recording devices in which data readable by a computer system is stored. Examples of the computer-readable medium include a hard disk drive (HDD), a solid state disk (SSD), a silicon disk drive (SDD), ROM, RAM, CD-ROM, magnetic tapes, floppy disks, and optical data storages, and also include that the computer-readable medium is implemented in the form of carrier waves (e.g., transmission through the Internet). Accordingly, the detailed description should not be construed as being limitative from all aspects, but should be construed as being illustrative. The scope of the present invention should be determined by reasonable analysis of the attached claims, and all changes within the equivalent range of the present invention are included in the scope of the present invention.

The effects of the intelligent voice output method, voice output apparatus and intelligent computing device according to an embodiment of the present invention are as follows.

In the present invention, although a voice output device and a voice speaker are positioned at a long distance, a response from the voice output device can be clearly delivered to the user.

Furthermore, in the present invention, although noise around a voice output device and a speaker is severe, a response from the voice output device can be properly delivered to the user.

Effects which can be achieved by the present invention are not limited to the above-mentioned effects. That is, other objects that are not mentioned may be obviously understood by those skilled in the art to which the present invention pertains from the following description.

What is claimed is:

1. An intelligent voice output method, comprising:
obtaining a voice;
selecting a response device for a response to the voice among a plurality of voice output devices; and
outputting a response related to the voice through the response device based on recognition state information of the voice recognized by the response device,
wherein the outputting the response comprises:
determining a spoken distance between the response device and a point at which the voice is spoken based on a result of the recognition of the voice by the response device, and
outputting the response based on the spoken distance, wherein determining a spoken distance comprises:
determining the spoken distance based on received intensity of a first microphone detection signal of the voice recognized by the response device when the response device succeeds in the recognition of the voice,
determining the point at which the voice is spoken based on received intensity of a second microphone detection signal of the voice recognized by a first device successful in the recognition of the voice when the response device fails in the recognition of the voice, and
determining the spoken distance based on the point at which the voice is spoken, wherein outputting the response further comprises:
obtaining noise information around the response device based on the result of the recognition of the voice by the response device, and
outputting the response based on the noise information around the response device, and
wherein the obtaining the noise information comprises:
obtaining the noise information around the response device based on a signal to noise ratio (SNR) of the first microphone detection signal of the voice recognized by the response device when the response device succeeds in the recognition of the voice, and
determining the noise information around the response device based on an SNR of the second microphone detection signal of the voice recognized by the first device successful in the recognition of the voice when the response device fails in the recognition of the voice.

2. The method of claim 1,
wherein the obtaining the noise information comprises:
inputting an operating state of at least one of the plurality of voice output devices to a pre-trained noise model, and
obtaining estimated noise information determined based on the operating state,
wherein the outputting the response further comprises outputting the response based on the noise information and the estimated noise information.

3. The method of claim 2,
wherein the inputting the operating state to the pre-trained noise model comprises:
accessing a 5G wireless communication system providing a $5^{th}$ generation (5G) service,
connecting to the plurality of voice output devices through the 5G wireless communication system, and
receiving the operating state of each of the plurality of voice output devices from the plurality of voice output devices through the 5G service provided by the 5G wireless communication system.

4. The method of claim 3,
wherein the 5G service comprises a massive machine-type communication (mMTC) service, and
wherein the receiving the operating state of each of the plurality of voice output devices comprises receiving the operating state of each of the plurality of voice output devices from the plurality of voice output devices through an MTC physical uplink shared channel (MPUSCH) and/or an MTC physical uplink control channel (MPUCCH) which is a physical resource provided through the mMTC service.

5. The method of claim 4,
wherein the 5G wireless communication system comprises a narrowband-Internet of things (NB-IoT) system providing a system bandwidth related to some resource blocks of the 5G wireless communication system and providing the mMTC service, and
wherein the receiving the operating state of each of the plurality of voice output devices comprises:
performing an initial access procedure on the 5G wireless communication system through an anchor type carrier related to the NB-IoT system, and
receiving the operating state of each of the plurality of voice output devices from the plurality of voice output devices through a non-anchor type carrier related to the NB-IoT system.

6. The method of claim 1,
wherein the obtaining noise information comprises determining the point at which the voice is spoken based on the received intensity of the second microphone detection signal of the voice recognized by the first device successful in the recognition of the voice, and
wherein the outputting the a-response comprises outputting the response based on first surrounding noise information around the response device and second surrounding noise information around the point at which the voice is spoken.

7. A server, comprising:
a transceiver configured to obtain a voice from a plurality of voice output devices; and
a processor configured to:
select a response device for a response to the voice among the plurality of voice output devices and control the response device to output a response related to the voice based on recognition state information of the voice recognized by the response device through the transceiver,
determine a spoken distance between the response device and a point at which the voice is spoken based on a result of the recognition of the voice by the response device,
control the response device to output the response based on the spoken distance through the transceiver,
determine the spoken distance based on received intensity of a first microphone detection signal of the voice recognized by the response device when the response device succeeds in the recognition of the voice,
determine the point at which the voice is spoken based on received intensity of a second microphone detection signal of the voice recognized by a first device successful in the recognition of the voice when the response device fails in the recognition of the voice,
determine the spoken distance based on the point at which the voice is spoken,
control the response device to obtain noise information around the response device based on the result of the recognition of the voice by the response device and output the response based on the noise information around the response device,
obtain the noise information around the response device based on a signal to noise ratio (SNR) of the first microphone detection signal of the voice recognized by the response device when the response device succeeds in the recognition of the voice, and
determine the noise information around the response device based on an SNR of the second microphone detection signal of the voice recognized by the first device successful in the recognition of the voice when the response device fails in the recognition of the voice.

8. The server of claim 7,
wherein the processor is configured to:
input an operating state of at least one of the plurality of voice output devices to a pre-trained noise model, and
control the response device to obtain estimated noise information determined based on the operating state and to output the response based on the noise information and the estimated noise information.

9. The server of claim 8,
wherein the processor is configured to control the transceiver to:
access a 5G wireless communication system providing a $5^{th}$ generation (5G) service,
connect to the plurality of voice output devices through the 5G wireless communication system, and
receive the operating state of each of the plurality of voice output devices from the plurality of voice output devices through the 5G service provided by the 5G wireless communication system.

10. The server of claim 9,
wherein the 5G service comprises a massive machine-type communication (mMTC) service, and
wherein the processor is configured to control the transceiver to receive the operating state of each of the plurality of voice output devices from the plurality of voice output devices through an MTC physical uplink shared channel (MPUSCH) and/or an MTC physical uplink control channel (MPUCCH) which is a physical resource provided through the mMTC service.

11. The server of claim 10,
wherein the 5G wireless communication system comprises a narrowband-Internet of things (NB-IoT) system providing a system bandwidth related to some resource blocks of the 5G wireless communication system and providing the mMTC service, and
wherein the processor is configured to control the transceiver to:
perform an initial access procedure on the 5G wireless communication system through an anchor type carrier related to the NB-IoT system, and
receive the operating state of each of the plurality of voice output devices from the plurality of voice output devices through a non-anchor type carrier related to the NB-IoT system.

12. The server of claim 7,
wherein the processor is configured to control the response device to:
determine the point at which the voice is spoken based on the received intensity of the second microphone detection signal of the voice recognized by the first device successful in the recognition of the voice, and
output the response based on first surrounding noise information around the response device and second surrounding noise information around the point at which the voice is spoken.

13. A non-transitory computer-readable recording medium in which a computer-executable component configured to be executed in at least one processor of a computing device is stored, wherein the computer-executable component:
obtains a voice from a plurality of voice output devices,
selects a response device for a response to the voice among the plurality of voice output devices, controls the response device to output a response related to the voice based on recognition state information of the voice recognized by the response device through a transceiver, determines a spoken distance between the response device and a point at which the voice is spoken based on a result of the recognition of the voice by the response device, controls the response device to output the response based on the spoken distance through the transceiver, determines the spoken distance based on received intensity of a first microphone detection signal of the voice recognized by the response device when the response device succeeds in the recognition of the voice, determines the point at which the voice is spoken based on received intensity of a second microphone detection signal of the voice recognized by a first device successful in the recognition of the voice when the response device fails in the recognition of the voice, determines the spoken distance based on the point at which the voice is spoken, controls the response device to obtain noise information around the response device based on the result of the recognition of the voice by the response device and to output the response based on the noise information around the response device, obtains the noise information around the response device based on a signal to noise ratio (SNR) of the first microphone detection signal of the voice recognized by the response device when the response device succeeds in the recognition of the voice, and determines the noise information around the response device based on an SNR of the second microphone detection signal of the voice recognized by the first device successful in the recognition of the voice when the response device fails in the recognition of the voice.

\* \* \* \* \*